(12) United States Patent  
Sassano et al.

(10) Patent No.: US 11,096,307 B2  
(45) Date of Patent: Aug. 17, 2021

(54) MEMBERS AND LOCKS FOR SECURING DEVICES AND/OR SLOTS IN A COMPUTER RACK

(71) Applicant: International Business Machines Corporation, Armonk, NY (US)

(72) Inventors: Camillo Sassano, Durham, NC (US); Paula Besterman, Cary, NC (US); Aaron R. Cox, Tucson, AZ (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/976,732

(22) Filed: May 10, 2018

(65) Prior Publication Data

US 2019/0350103 A1    Nov. 14, 2019

(51) Int. Cl.
*H05K 7/14* (2006.01)
*H05K 5/02* (2006.01)
*E05B 65/00* (2006.01)

(52) U.S. Cl.
CPC ......... *H05K 7/1489* (2013.01); *H05K 5/0221* (2013.01); *H05K 5/0226* (2013.01); *E05B 65/006* (2013.01)

(58) Field of Classification Search
CPC ...... H05K 7/1489; H05K 7/1488; H05K 7/18; H05K 5/0221; H05K 5/02; H05K 5/024;

(Continued)

(56) References Cited

U.S. PATENT DOCUMENTS

| 1,783,150 A | * | 11/1930 | Jeffery | ............ E05C 3/042 |
| | | | | 292/240 |
| 2,468,646 A | * | 4/1949 | Verhoff | ............ E05C 5/04 |
| | | | | 292/251 |

(Continued)

FOREIGN PATENT DOCUMENTS

WO    2015148552 A1    10/2015

OTHER PUBLICATIONS

Show Me Cables, "Vented Security Door—20 RU," 2018, 2 pages retrieved from https://www.showmecables.com/vsdr-20.

(Continued)

*Primary Examiner* — Daniel J Troy
*Assistant Examiner* — Timothy M Ayres
(74) *Attorney, Agent, or Firm* — Zilka-Kotab, P.C.

(57) ABSTRACT

A system according to one embodiment includes a pair of members for mounting to a computer rack in a parallel orientation relative to one another, at least two bezels configured for extending between the members and mounting to the members, and at least two locks for selectively locking the bezels to at least one of the members. A system according to another embodiment includes a frame for mounting to a computer rack. The frame includes members oriented in a rectangular configuration, at least two bezels configured for extending between opposite members of the frame, and at least two locks for selectively locking the bezels to at least one of the members. A system according to another embodiment includes a pair of members for mounting to a computer rack in a parallel orientation relative to one another, and an array of locks coupled to one of the members.

23 Claims, 17 Drawing Sheets

(58) Field of Classification Search
CPC .. H05K 5/0208; H05K 5/0204; H05K 5/0213; H05K 5/0217; H05K 5/0226; H05K 5/0243
USPC .................................................. 312/215
See application file for complete search history.

(56) References Cited

U.S. PATENT DOCUMENTS

| | | | | |
|---|---|---|---|---|
| 2,634,146 A * | 4/1953 | Johnson | ............... | E05C 3/042 292/194 |
| 2,775,947 A * | 1/1957 | Mosler | ............... | E05G 1/08 109/47 |
| 2,914,106 A * | 11/1959 | Boyd | ............... | F16B 19/1072 411/38 |
| 3,215,026 A * | 11/1965 | Davis | ............... | F16B 37/067 411/34 |
| 3,240,862 A * | 3/1966 | Merkl | ............... | H05K 9/0015 174/371 |
| 3,273,935 A | 9/1966 | Carson | | |
| 4,161,274 A * | 7/1979 | Bishop | ............... | A47G 29/1201 232/24 |
| 4,611,841 A * | 9/1986 | Ravinet | ............... | A47B 95/00 292/241 |
| 5,520,291 A * | 5/1996 | Graham | ............... | A47B 81/005 211/4 |
| 5,992,808 A * | 11/1999 | Morrow | ............... | H02B 1/042 211/26 |
| 6,209,367 B1 * | 4/2001 | Hyatt, Jr. | ............... | E05B 47/0002 70/278.1 |
| 6,247,641 B1 * | 6/2001 | Noblet | ............... | A47G 29/1201 232/17 |
| 6,259,605 B1 | 7/2001 | Schmitt | | |
| 6,628,512 B2 | 9/2003 | Searby et al. | | |
| 6,658,700 B2 | 12/2003 | Wortman et al. | | |
| 6,658,904 B2 * | 12/2003 | Herbeck | ............... | F24F 3/0442 138/149 |
| 6,695,149 B1 | 2/2004 | Cote et al. | | |
| 6,758,353 B2 | 7/2004 | Orr | | |
| 6,806,807 B2 * | 10/2004 | Cayne | ............... | G07C 9/257 340/5.52 |
| 6,826,057 B1 * | 11/2004 | Gundogan | ............... | H05K 7/1425 361/724 |
| 6,909,611 B2 | 6/2005 | Smith et al. | | |
| 6,925,843 B1 | 8/2005 | Pols Sandhu et al. | | |
| 6,925,943 B2 * | 8/2005 | Salmanson | ............... | A47B 57/22 108/107 |
| 7,113,762 B1 * | 9/2006 | Hertz | ............... | H05K 7/1488 361/600 |
| 7,151,666 B2 * | 12/2006 | Song | ............... | H05K 7/1487 361/692 |
| 7,152,936 B2 | 12/2006 | Tarasewicz | | |
| 7,269,020 B2 | 9/2007 | Wang et al. | | |
| 7,317,619 B2 * | 1/2008 | Karstens | ............... | H05K 7/1409 361/732 |
| 7,445,255 B2 * | 11/2008 | Nye-Hingston | .... | E05B 15/0205 292/144 |
| 7,726,751 B2 * | 6/2010 | Bergmann | ............... | E05B 65/02 312/222 |
| 7,748,606 B2 * | 7/2010 | Mikolajczyk | ...... | A47G 29/1201 232/45 |
| 7,850,013 B1 | 12/2010 | Kramer et al. | | |
| 8,474,759 B2 * | 7/2013 | Keener | ............... | B29C 66/721 244/131 |
| 8,490,443 B2 * | 7/2013 | Gokcebay | .......... | G07C 9/00666 70/214 |
| 8,939,523 B2 | 1/2015 | Yu et al. | | |
| 8,955,693 B2 * | 2/2015 | Larsen | ............... | H02G 3/0418 211/26 |
| 9,078,349 B1 | 7/2015 | Lewis et al. | | |
| 9,078,369 B2 * | 7/2015 | Iwasaki | ............... | H05K 7/1489 |
| 9,232,669 B2 * | 1/2016 | Love, II | ............... | E06B 9/01 |
| 9,232,678 B2 | 1/2016 | Bailey et al. | | |
| 9,247,318 B2 | 1/2016 | Teeter | | |
| 9,271,884 B2 | 3/2016 | Mitchell | | |
| 9,357,669 B2 | 5/2016 | House | | |
| 9,684,806 B2 | 6/2017 | Bailey | | |
| 9,926,725 B2 * | 3/2018 | AbuGhazaleh | ....... | E05B 65/006 |
| 10,435,937 B2 * | 10/2019 | Savage | ............... | A47B 81/00 |
| 2003/0233855 A1 | 12/2003 | Pirveysian | | |
| 2004/0035995 A1 | 2/2004 | Chen et al. | | |
| 2005/0179349 A1 * | 8/2005 | Booth | ............... | G06Q 20/341 312/257.1 |
| 2005/0200247 A1 | 9/2005 | Tarasewicz | | |
| 2010/0277866 A1 * | 11/2010 | Chen | ............... | G06F 21/74 361/679.57 |
| 2011/0068073 A1 * | 3/2011 | Hervey | ............... | H05K 7/1488 211/169 |
| 2012/0104200 A1 | 5/2012 | Grady, IV et al. | | |
| 2014/0268514 A1 | 9/2014 | Teeter | | |
| 2014/0317902 A1 | 10/2014 | Helbig et al. | | |
| 2015/0194002 A1 * | 7/2015 | Kaczmarz | .......... | G07C 9/00174 340/5.2 |
| 2015/0282349 A1 * | 10/2015 | Mann | ............... | H05K 5/0217 312/283 |
| 2015/0282373 A1 | 10/2015 | AbuGhazaleh et al. | | |
| 2016/0215526 A1 | 7/2016 | AbuGhazaleh | | |
| 2017/0024946 A1 * | 1/2017 | Hashemi | ............... | A47G 29/141 |
| 2017/0257969 A1 | 9/2017 | Kuan et al. | | |
| 2018/0303005 A1 * | 10/2018 | Besterman | ........... | H05K 7/1489 |

OTHER PUBLICATIONS

Besterman et al., U.S. Appl. No. 15/486,198, filed Apr. 12, 2017.
Dell, "PowerEdge R710 Technical Guidebook," Jan. 2011, pp. 1-63.

* cited by examiner

MEMBERS AND LOCKS FOR SECURING DEVICES AND/OR SLOTS IN A COMPUTER RACK

FIELD OF THE INVENTION

The present invention relates to computer rack locking components, and more particularly, this invention relates to the access and security of devices and/or the slots in a computer rack.

BACKGROUND

Some computer racks are designed and fabricated to meet specific conventional design standards. One such design standard includes the Electronic Industries Alliance (EIA) standard. Computers inserted into the computer racks may also be designed and/or fabricated according to the same and/or similar standards to facilitate conformity.

In co-siting environments, computer racks are often shared by different customers (also known as "co-location systems"). The contents of such computer racks often host equipment of different types. For example, a computer rack may house computers with different heights (referred herein as "U(s)"), manufacturer types, interface/access assemblies, etc.

Some computer racks include a single locking door for the entire computer rack. However, where multiple customers share a common computer rack, the various customers use a common key, and therefore have access to the other customers' computers. This may make some customers of the shared computer rack uncomfortable, as the security and integrity of their computers may be compromised by someone who is not authorized to access particular computers of the rack.

Moreover, some rack mounted systems themselves may have a locking mechanism, but such mechanisms are specific to the particular system.

SUMMARY

A system according to one embodiment includes a pair of members for mounting to a computer rack in a parallel orientation relative to one another, at least two bezels configured for extending between the members and mounting to the members, and at least two locks for selectively locking the bezels to at least one of the members. Each lock is mounted to one of the bezels. Moreover, each of the members includes a plurality of mounting features for engaging cooperating mounting features of the bezels and a portion of the locks. At least one of the members has a plurality of alignment features for engagement with cooperating alignment features of each of the bezels.

Unauthorized access to computers of a computer rack may be selectively prevented in response to the bezels being locked to the members. For example, while extending between two members, a bezel selectively locked to at least one of the members, may cover an outer face of a computer stored in the computer rack. Covering an outer face of the computer may be important for protecting the security and privacy of a customer who owns the computer, especially if the computer rack is a shared computer rack. Accordingly, unauthorized customers, such as other customers of the shared computer rack who are not authorized to access the computer, will be prevented from accessing ports of the outer face of the computer, selecting controls of the outer face of the computer, removing the computer from a slot of the computer rack, etc.

Unauthorized access to an at least temporarily empty slots of the computer rack may additionally and/or alternatively be selectively prevented by bezels being locked to members. This will be desirable to a customer and/or manager of a computer rack, as covering an opening of an at least temporarily empty slot of a computer rack prevents unauthorized users from claiming temporarily empty computer rack slots for their use without renting and/or gaining permission to do so.

A system according to another embodiment includes a frame for mounting to a computer rack. The frame includes members oriented in a rectangular configuration, at least two bezels configured for extending between opposite members of the frame, and at least two locks for selectively locking the bezels to at least one of the members. Each lock is mounted to one of the bezels. Each of the members includes a plurality of mounting features for engaging cooperating mounting features of the bezels and a portion of the locks. At least one of the members has a plurality of alignment features for engagement with cooperating alignment features of each of the bezels.

Unauthorized access to computers of a computer rack may be selectively prevented in response to the bezels being locked to members of the frame. For example, while extending between two members of the frame, a bezel selectively locked to at least one of the members, may cover an outer face of a computer stored in the computer rack. Covering an outer face of the computer may be important for protecting the security and privacy of a customer who owns the computer, especially if the computer rack is a shared computer rack. Accordingly, unauthorized customers, such as other customers of the shared computer rack who are not authorized to access the computer, will be prevented from accessing ports of the outer face of the computer, selecting controls of the outer face of the computer, removing the computer from a slot of the computer rack, etc.

Unauthorized access to an at least temporarily empty slots of the computer rack may additionally and/or alternatively be selectively prevented by bezels locked to members of the frame. This will be desirable to a customer and/or manager of a computer rack, as covering an opening of an at least temporarily empty slot of a computer rack prevents unauthorized users from claiming temporarily empty computer rack slots for their use without renting and/or gaining permission to do so.

A system according to another embodiment includes a pair of members for mounting to a computer rack in a parallel orientation relative to one another, and an array of locks coupled to one of the members. Each of the locks include an extending portion that is configured to selectively switch between an extended position and a retracted position. Each of the extended portions of the locks, when in the extended position, block a device from being inserted into and/or removed from a respective slot of the computer rack.

Selectively blocking a device from being inserted into and/or removed from a respective slot of the computer rack prevents unauthorized insertion and/or removal of a device in a computer rack. Such selectively blocking of a device from being inserted into and/or removed from a respective slot of the computer rack is especially important and useful in a shared computer rack. Accordingly, unauthorized customers, such as other customers of the shared computer rack who are not authorized to insert and/or remove a device from a respective slot of the shared computer rack will be prevented from doing so. This will be desirable to a customer and/or manager of a computer rack. This is because unauthorized users will not be able to gain access to at least temporarily empty slots of the computer rack for their use without renting and/or gaining permission to do so. Moreover, such unauthorized users will be prevented from removing devices that they do not own from the computer rack without permission.

Other aspects and advantages of the present invention will become apparent from the following detailed description, which, when taken in conjunction with the drawings, illustrate by way of example the principles of the invention.

DETAILED DESCRIPTION

Figure 1A:
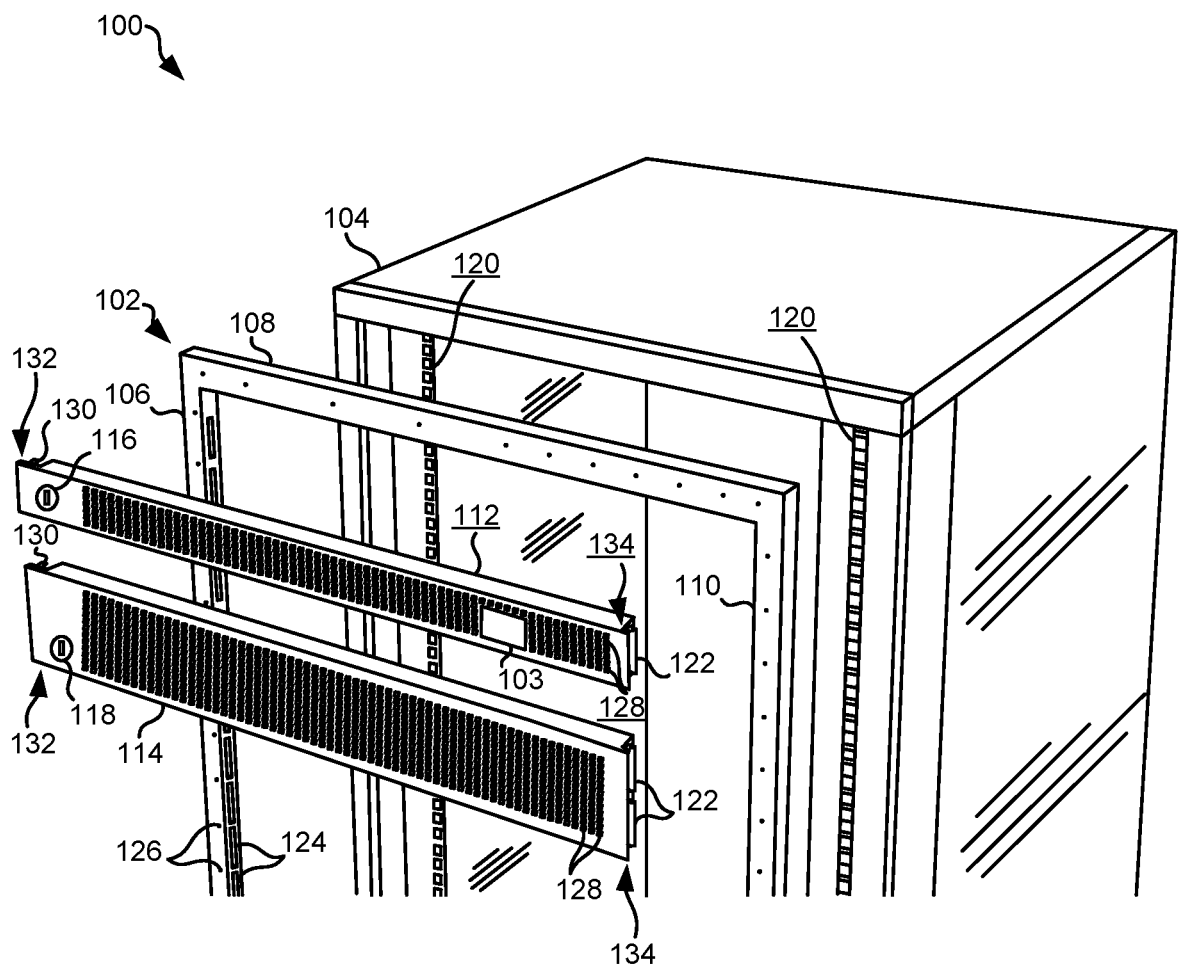
FIG. 1A is an exploded partial perspective view of a frame, two bezels with locks, and a computer rack.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of members and locks for establishing selective access of computers and/or slots in a computer rack.

In one general embodiment, a system includes a pair of members for mounting to a computer rack in a parallel orientation relative to one another, at least two bezels configured for extending between the members and mounting to the members, and at least two locks for selectively locking the bezels to at least one of the members.

In another general embodiment, a system includes a frame for mounting to a computer rack. The frame includes members oriented in a rectangular configuration, at least two bezels configured for extending between opposite members of the frame, and at least two locks for selectively locking the bezels to at least one of the members.

In yet another general embodiment, a system includes a pair of members for mounting to a computer rack in a parallel orientation relative to one another, and an array of locks coupled to one of the members. Each of the locks include an extending portion that is configured to selectively switch between an extended position and a retracted position. Each of the extended portions of the locks, when in the extended position, block a device from being inserted into and/or removed from a respective slot of the computer rack.

Some conventional computer rack configurations have customer equipment mounted in open racks, e.g., racks without doors or sides. However, a drawback of such computer racks is that each customer's individually mounted equipment is not secured, and therefore susceptible to access and/or theft. This is problematic because such equipment often includes the customer's sensitive and/or private data.

Other conventional computer racks include a large rack door that covers the entire rack frame, where different customers use common keys to unlock the security door to access computers mounted on the computer rack. However, the use of common keys does not provide individual customer security, which thereby compromises individual computer privacy. Moreover, if the rack door does not provide individual customer security, these customers may not wish to use a rack door at all.

Various embodiments described herein include systems having members and locks for selectively locking individual customer devices such as computers, servers, networking devices, storage devices, power, etc. and/or a slot in a computer rack.

While much of the following description describes various components in conjunction with a computer rack system, it should be understood that some embodiments may include the components alone.

FIGS. 1A-1J depict a system 100 for selectively locking devices and/or slots of a computer rack, in accordance with one embodiment. As an option, the present system 100 may be implemented in conjunction with features from any other embodiment listed herein, such as those described with reference to the other FIGS. Of course, however, such system 100 and others presented herein may be used in various applications and/or in permutations which may or may not be specifically described in the illustrative embodiments listed herein. Further, the system 100 presented herein may be used in any desired environment.

Figure 1B:
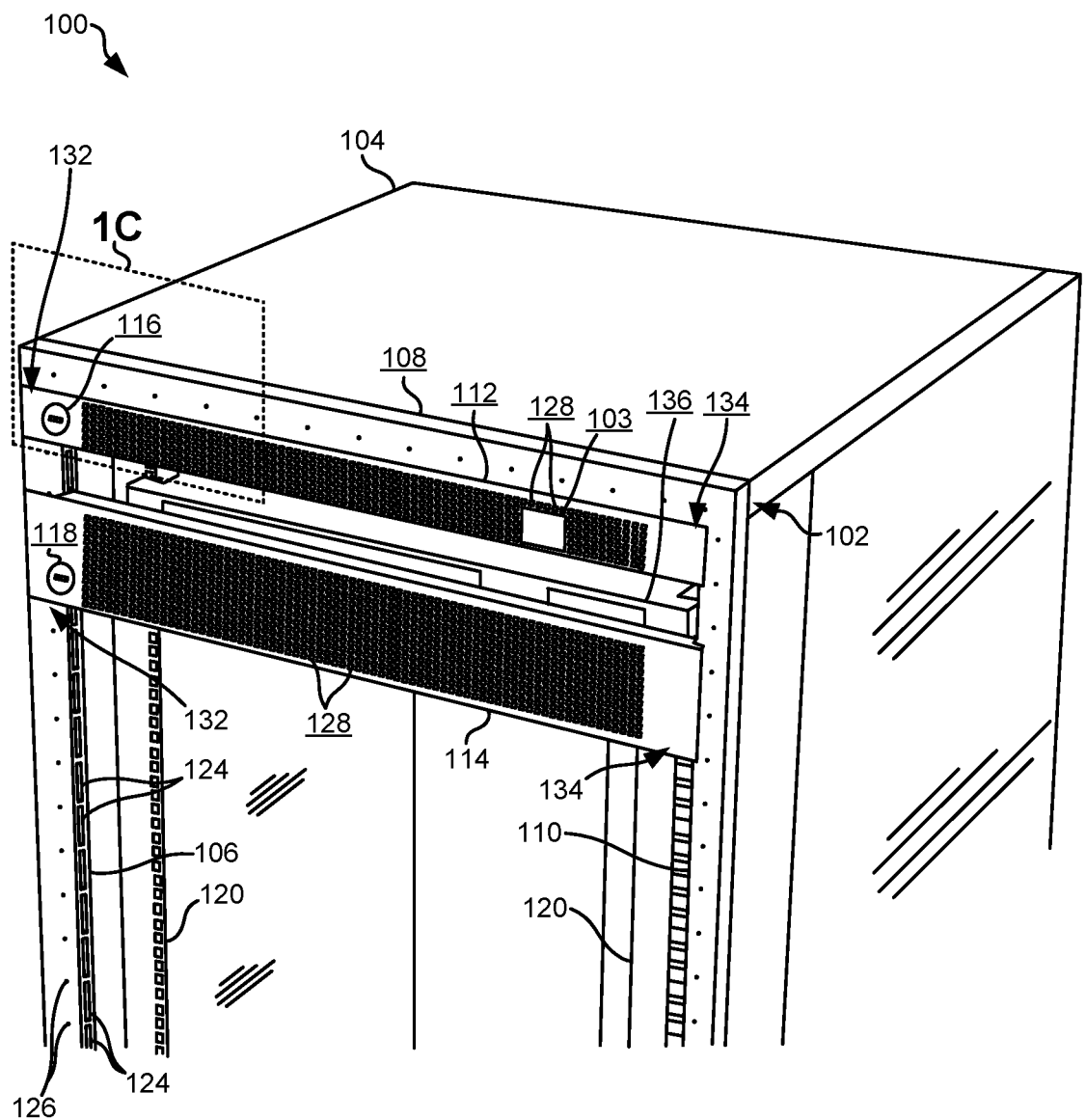
FIG. 1B is a partial perspective view of the frame, two bezels with locks, and the computer rack of FIG. 1A.
Figure 1C:
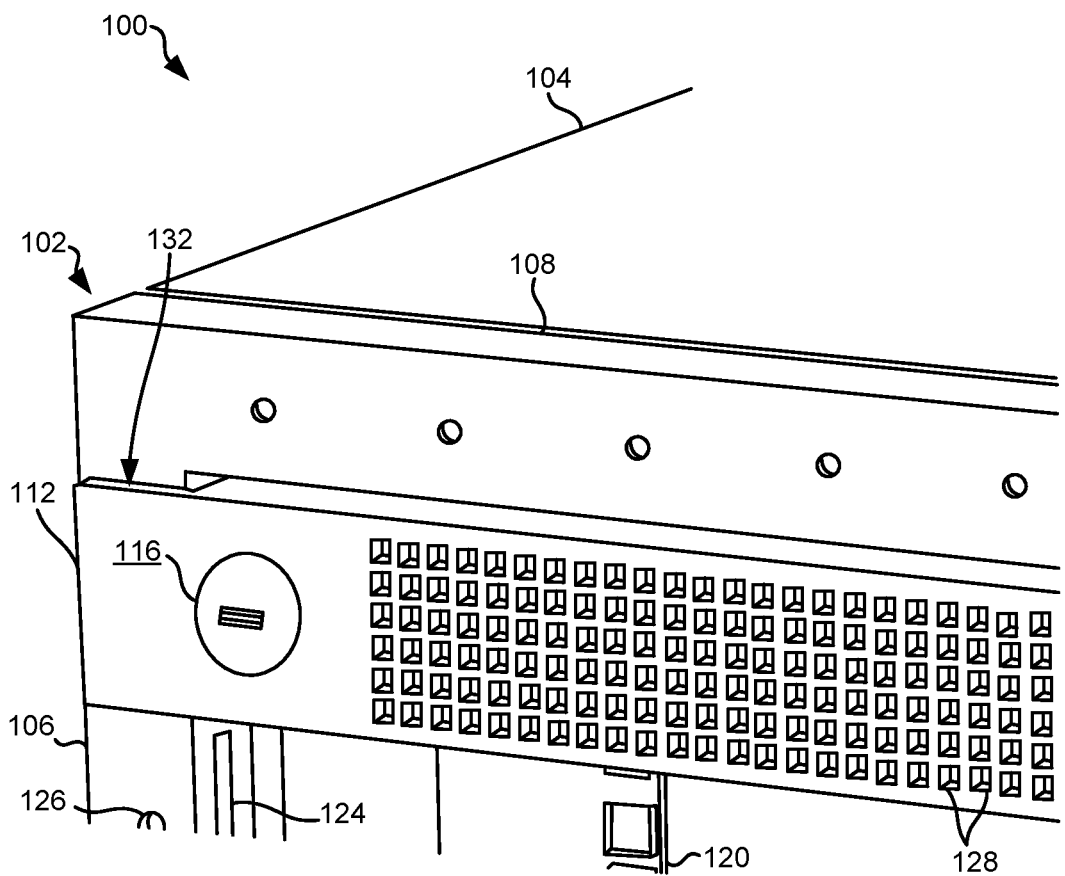
FIG. 1C is a partial perspective view of a sub-portion of FIG. 1B taken from section 1C of FIG. 1B.
Figure 1D:
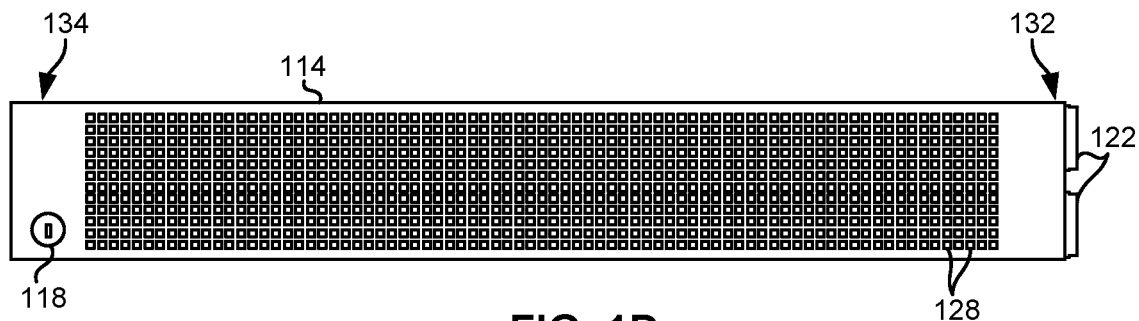
FIG. 1D is a side view of one of the bezels of FIGS. 1A-1B.
Figure 1E:
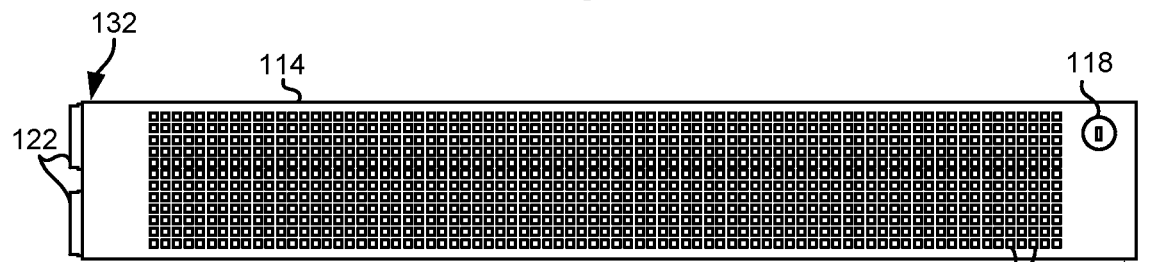
FIG. 1E is a side view of one of the bezels of FIGS. 1A-1B.
Figure 1F:
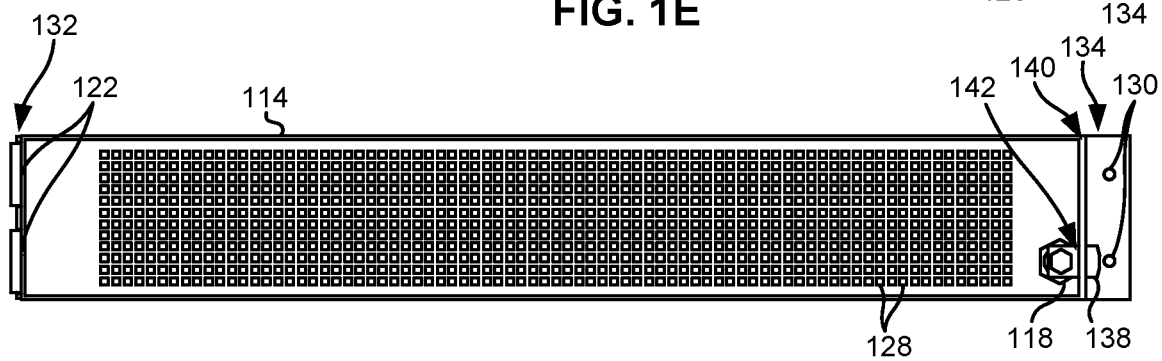
FIG. 1F is a side view of one of the bezels of FIGS. 1A-1B.
Figure 1G:
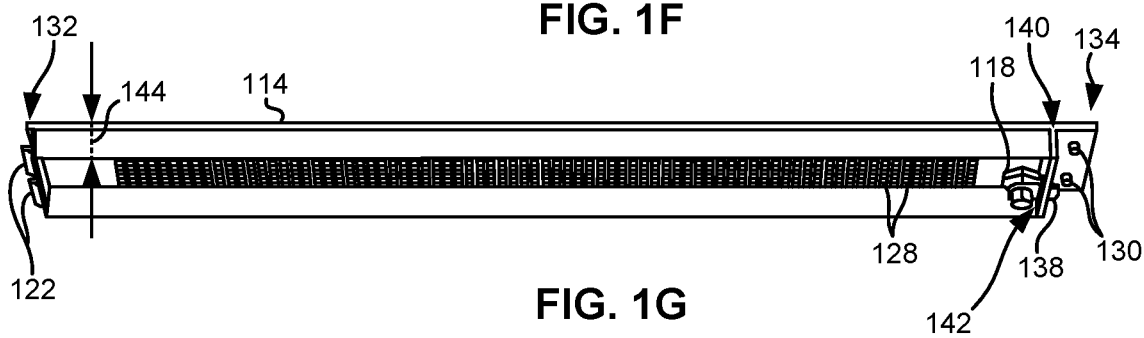
FIG. 1G is a perspective view of one of the bezels of FIGS. 1A-1B.
Figure 1H:
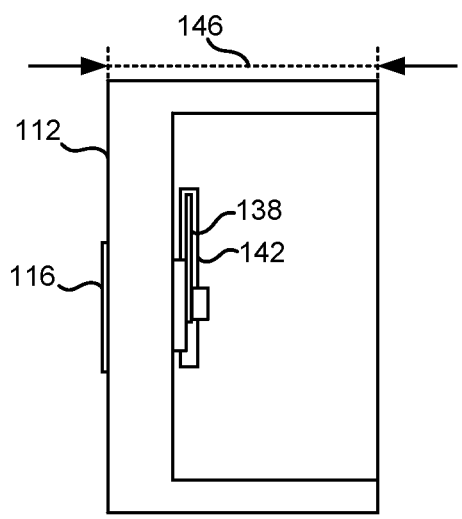
FIG. 1H is a cross-sectional side view of one of the bezels of FIGS. 1A-1C.
Figure 1I:
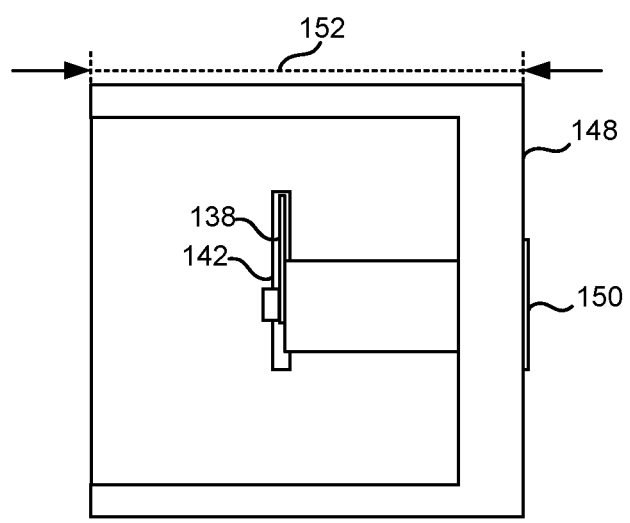
FIG. 1I is a cross-sectional side view of a bezel with a deeper cross-sectional profile in a depth direction than the bezel of FIG. 1H.
Figure 1J:
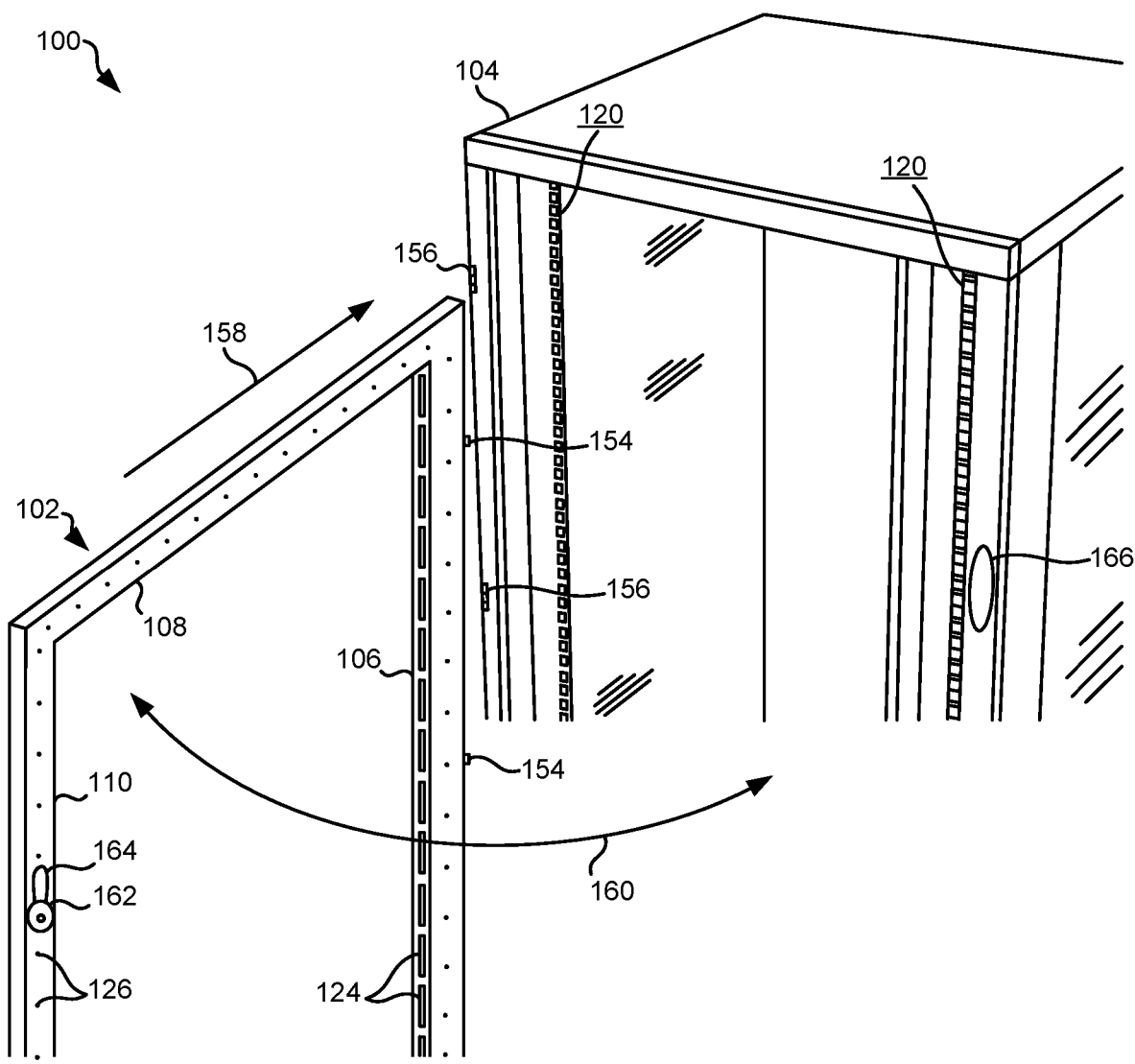
FIG. 1J is an exploded partial perspective view of a frame with rotatable coupling and a computer rack.

It should be noted that FIGS. 1A-1B, and 1J depict a majority portion of system 100, while FIGS. 1C-1I depict smaller sub-portions and/or isolated components thereof.

Referring now to FIG. 1A, system 100 includes a frame 102 for mounting to a computer rack 104. The frame 102 may include members 106, 108, 110 oriented in a rectangular (including square) configuration, although in the present embodiment note that the fourth member of the frame 102 that completes the rectangular configuration is not visible in FIGS. 1A-1G, 1J. However, a similar frame showing four members can be referenced elsewhere herein, e.g., see FIG. 4A. Accordingly, references to each of the members in the present embodiment may correspond to all four members of the frame 102.

With reference again to FIG. 1A, in preferred approaches, each of the members are coupled to the computer rack, e.g., via secure fasteners, welding, rivets, adhesives, etc. According to other more specific approaches, each of the members may be additionally and/or alternatively coupled to the computer rack, e.g., via screws, anti-tamper fasteners, breakaway fasteners, etc. According to yet another approach each of the members may be additionally and/or alternatively coupled to the computer rack using a lock and key. In such an approach, the lock may be mounted to the frame, and engages the frame to lock the frame 102 to the computer rack 104, e.g., as will be described in greater detail in FIG. 1J.

According to preferred approaches, each of the members of the frame 102 are preferably coupled to an outer portion of the computer rack 104, e.g., see FIGS. 1A-1B. Accordingly, the members of the frame 102 do not impede normal operations and/or equipment of the computer rack 104, e.g., insertion of computers into slots of the computer rack, removal of computers from slots of the computer rack, access to rack rails 120, etc.

For present purposes, a slot may be defined as a space in the computer rack 104 between the rack rails 120 for receiving a computer, used herein to collectively refer to any electronic component that may be mounted in a rack. The dimensions of a slot preferably correspond to some rack unit value "U" or multiple thereof. Typical slots are 1 U, 2 U, 3 U, or more U's high, and in a simple rack do not have barriers defining the slots. Moreover, in some approaches, a slot may not be defined in a computer rack 104 until the slot is allocated to an entity, e.g., a 2 U slot is rented to a customer for inclusion of the customer's computer therein. Moreover, it should be noted that any of the components of system 100 may correspond to EIA specifications. For example, such components may be compliant with EIA-310 specifications. EIA-310 specifications standardize features of a standard rack, for example, rack unit dimensions, vertical hole spacing, horizontal hole spacing, rack opening, front panel width, etc. According to another approach, components of system 100 may be compliant with a computer and/or rack specification that would be appreciated by one skilled in the art upon reading the present descriptions.

The computer rack 104 may be configured to accept any type of computer, e.g., a server, a microcomputer, a network hub, storage array, etc. Accordingly, although system 100 is not illustrated to include any computer in FIG. 1A, it should be noted that the slots of the computer rack 104 may contain one or more of such computers, e.g., see FIG. 1B. Moreover, one or more slots of the computer rack 104 may additionally and/or alternatively be empty, e.g., at least temporarily not include a computer therein, such as shown in some portions of the computer rack 104 in FIGS. 1A-1C, 1J.

System 100 also includes at least two bezels configured for extending between opposite members of the frame 102 and mounting to the members. For example, a first bezel 112 and a second bezel 114 are configured to extend between opposite members 106, 110 of the frame 102. As described in more detail below, the bezels may be locked to the members for securing a respective computer there-behind in the rack.

Portions of the bezels 112, 114, e.g., see first ear 132 and second ear 134 of each of the bezels 112, 114, may be configured for extending beyond the area between the opposite members of the frame 102. The ears 132, 134 may have any desired length. For example, referring to FIG. 1B, with the bezels 112, 114 locked to the members 106, 110 of the frame 102, the ears 132 of the bezels 112, 114 may extend flush to an outer contour of the members 106, 110, and the ears 134 of the bezels 112, 114 may extend across a partial portion of the members 106, 110.

The ears 132, 134 may provide any of a variety of functions. For example, the ears may provide a substrate for alignment features 130, which are described below. The ears may also and/or alternatively partially cover any components that are used to couple and/or lock the bezels 112, 114 to the members 106, 108, 110, thereby preventing tampering.

According to various approaches, one or both of the ears 132, 134 may at least partially cover any components that are used to couple the members 106, 108, 110 to the computer rack 104. For example, assume that the frame 102 is coupled to the computer rack 104 using screws that pass through the members 106, 110 and at least a portion of the computer rack 104. The ears 132, 134 may be configured to at least partially cover heads of such screws, thereby preventing an unauthorized user from simply unscrewing the screws in order to remove the frame from the computer rack 104 and access the computers and/or slots therein. Of course, the ears 132, 134 may vary, e.g., in length, in thickness, in shape, etc., in conformance with the various coupling types for the members 106, 108, 110 and the computer rack 104 described elsewhere herein.

System 100 also includes at least two locks 116, 118 for selectively locking the bezels 112, 114 to at least one of the members of system 100. According to one approach, as illustrated in FIGS. 1A-1G, each lock 116, 118 may be mounted to a respective one of the bezels 112, 114. Locks of a type known in the art may be used. Moreover, the locks used on the various bezels may be the same type or different.

Referring now to FIG. 1B, one or all of the bezels 112, 114 of system 100 may be locked to at least one of the members of system 100 for locking and/or preventing access to computers 136 and/or slots of the computer rack 104.

For purpose of the present embodiment, assume that the bezel 112 is a 1 U bezel that provides selective access to an associated 1 U slot of the computer rack 104 (behind the bezel 112 in FIG. 1B). Moreover, assume that the bezel 114 is a 2 U bezel that provides selective access to an associated 2 U slot of the computer rack 104 (behind the bezel 114 in FIG. 1B).

Each of the members of system 100 may include a plurality of mounting features for engaging cooperating mounting features of the bezels and a portion of the locks. For example, according to one approach, each of the members may include slot mounting features 124 which may engage with tab cooperating mounting features 122 (FIG. 1A) of the bezels 112, 114. According to various other approaches, mounting features of the members of system 100 may additionally and/or alternatively include any one or more of holes, tabs, indentations, etc., or any combinations thereof. Similarly, cooperating mounting features of the bezels of system 100 may additionally and/or alternatively include any one or more of pins, ridges, apertures, etc., or any combinations thereof.

Unauthorized access to computers of the computer rack 104 may be selectively prevented in response to bezels 112, 114 being locked to members of system 100. For example, with continued reference to FIG. 1B, while locked to the members 106, 110, the bezel 114 covers an outer face of the computer 136. Covering an outer face of the computer 136 may be important for protecting the security and privacy of a customer who owns the computer 136, especially if the computer rack 104 is a shared computer rack. For example, according to various approaches, as a result of the bezel 114 covering an outer face of a computer 136, unauthorized customers, such as other customers of the shared computer rack 104 who are not authorized to access the computer 136, will be prevented from accessing the computer 136, e.g., accessing ports of the outer face of the computer 136, selecting controls of the outer face of the computer 136, removing the computer 136 from the slot of the computer rack 104, etc.

Unauthorized access to an at least temporarily empty slot of the computer rack 104 may additionally and/or alternatively be selectively prevented by bezels 112, 114 locked to members of system 100. For example, assume that in FIG. 1B the computer rack 104 includes an empty slot that is covered by the bezel 112. Covering an opening of the at least temporarily empty slot of the computer rack 104 may provide security and/or selective access to the partially populated computer rack 104, which may be desirable to a customer and/or manager of the computer rack 104. Covering an opening of an at least temporarily empty slot of the computer rack 104 may also prevent unauthorized users from claiming temporarily empty computer rack slots for their use without renting and/or gaining permission to do so.

It should be noted that such selective security options are not otherwise available in shared conventional computer racks that solely include a single large locking door for security purposes. This is because the multiple customers of such shared computer racks often share a common key, and therefore have access to the other customers' computers and/or empty slots of the computer rack. In sharp contrast, the current system 100 and various other embodiments described herein provide individual security for customers that have a computer in a shared computer rack, and/or overall security for managers of the shared computer rack that has one or more at least temporarily empty slots therein.

It should moreover be noted that portions of the locks 116, 118 of the bezels 112, 114 configured for engaging with the slot mounting features 124 of the members 106, 108, 110 are obstructed from view in FIGS. 1A-1C by an outer surface of the bezels 112, 114. However, such portions of the locks 116, 118 will be described elsewhere herein, e.g., see FIGS. 1F and 1G.

Referring now again to FIG. 1A, at least one of the members 106, 108, 110 of the frame 102 may include a plurality of alignment features 126 for engagement with cooperating alignment features 130 of each of the bezels 112, 114. The engagement of the alignment features 126 and the cooperating alignment features 130 may properly position the bezels 112, 114 with respect to opposing members of the frame 102. This alignment of the bezels 112, 114 may assist and/or guide the locking of the bezels 112, 114 to the frame 102.

Moreover, it should be noted that the engagement of the alignment features 126 and the cooperating alignment features 130 of each of the bezels 112, 114 may ensure that the bezels 112, 114 are constrained vertically when the bezels 112, 114 are locked to the frame 102. For example, according to one approach, the engagement of the alignment features 126 and the cooperating alignment features 130 of each of the bezels 112, 114 may strengthen the locking of the bezels 112, 114 to the members 106, 110 of the frame 102. According to one specific example made with reference to FIG. 1B, the engagement of the alignment features 126 and the cooperating alignment features 130 of each of the bezels 112, 114 may oppose any pulling and/or pressing of the bezel along the plane of the frame 102 by an unauthorized user attempting to detach the bezel from the frame.

According to one approach, as illustrated in FIG. 1A, the alignment features 126 may include holes that are configured to accept cooperating pin alignment features 130, where the diameters of the cooperating pin alignment features 130 are slightly smaller than the diameters of the associated hole alignment features 126. According to other approaches, the alignment features may have any shape, e.g., a triangle, a square, an oval, etc., and/or configuration provided that the cooperating alignment features 130 of each of the bezels 112, 114 are substantially paired in shape and cooperating configuration with an associated alignment features 126.

With continued reference to FIG. 1A, at least one of the bezels 112, 114 may include apertures therein for allowing airflow therethrough, e.g., see apertures 128. The apertures 128 of the bezels 112, 114 may allow cooling airflow to access the front of a computer when a bezel is covering the front of the computer. For example, referring now to FIG. 1B, the apertures 128 of the bezel 114 may allow cooling airflow to access the front of the computer 136 when the bezel 114 covers the front of the computer 136.

According to various approaches, the apertures 128 of the bezels 112, 114 may vary, e.g., in size, in configuration, in transparency, etc. For example, according to one approach, the layout of the apertures 128 of the bezels 112, 114 may be configured to conceal viewing of a graphical interface (not shown) of the computer 136. According to specific examples, a graphical interface may include, e.g., a light emitting diode (LED) indicator display, a data log display, a displayed serial number of the computer 136, etc.

According to various approaches, at least one of the bezels 112, 114 may additionally and/or alternatively include a cutout 103 for allowing viewing of a graphical interface of a computer stored in the computer rack 104. According to one specific approach, the cutout 103 may include a window therein, e.g., a glass window, a plastic window, etc. According to another specific approach, the cutout 103 may include an air filter therein. According to yet another approach, the cutout 103 of the bezel 112 may be configured to allow a user to access a selective portion of computer controls of a computer stored in the computer rack 104. According to yet another approach, the cutout 103 of the bezel 112 may be configured to not add any airflow impedance to the computer rack 104 of system 100 when the bezels 112 is locked to at least one of the members of system 100.

System 100 may further include a second frame for mounting to an opposite side of the computer rack 104 as the frame 102. Similar to the frame 102, the second frame may include a plurality of members. Accordingly, at least two second bezels may be configured for extending between opposite members of the second frame. Moreover, at least two second locks may selectively lock the second bezels to the second frame. Of course, similar to the locks configured to lock the bezels to the frame 102, the two second locks of the second frame may be each coupled to one of the second bezels and/or mounted to the second frame, depending on the approach.

In such approaches, the second bezels of the second frame may cover a back of one or more computers in the computer rack 104 when one more of the second bezels are selectively locked to the second frame. It should be noted that according to some approaches, one or more of the second bezels may include cutouts for allowing power cords and cables to pass from the back of a computer therethrough. Such cutouts may be included on the second bezels in addition and/or alternative to, e.g., apertures for controlling airflow, apertures for viewing of the back of the computer, apertures for viewing a displayed serial number of the computer, etc.

System 100 may further include any number of members and/or bezels, on any number of sides of the computer rack 104. For example, the system 100 may include frames on all side of the computer rack 104, with bezels locked to members of the frames for preventing unauthorized access to any associated computers and/or empty slots of the computer rack 104.

Locking bezels to more than one side of a computer rack provides selective security to more than one side of a computer that may be accessible from the outside of the computer rack. Such approaches may be desirable especially to customers of a shared computer rack and provide comprehensive privacy/selective security of such customer's computers when stored in the computer rack.

Referring now to FIG. 1C, a sub-portion of FIG. 1B taken from section 1C is illustrated. The lock 116 of the bezel 112 is shown selectively locking the bezel 112 to the member 106. Moreover, the lock 116 selectively locking the bezels 112 to the member 106 prevents unauthorized access to the empty slot of the computer rack 104 behind the bezel 112.

Referring now to FIGS. 1D-1E, a side view the bezel 114 illustrates various portions of the bezel 114 of FIGS. 1A-1B.

According to various approaches, the bezel 114 is configured to engage with members of system 100 in any orientation that allows mounting features of the members to engage with the tab cooperating mounting features 122 of the bezel 114 and a portion of the lock 118. For example, as illustrated in FIG. 1D, the bezel may be installed with the lock on the left and the tab cooperating mounting features 122 on the right. In another example, as illustrated in FIG. 1E, the bezel may be installed with the lock on the right and the tab cooperating mounting features 122 on the left.

Referring now to FIG. 1F, an opposite side of the bezel 114 is shown than that of FIGS. 1D-1E. According to various approaches, the lock 118 may include any type of portion 138 for engaging with the slot mounting features 124 of the members of system 100. For example, according to one approach, the lock 118 may include a tab portion, as illustrated in FIGS. 1F-1G According to other approaches, the lock 118 may additionally and/or alternatively include any one or more of, e.g., ears, flags, tabs, hooks, pins, etc.

According to one approach, the portion 138 of the lock 118 may pass through a cutout 142 of a portion 140 of the bezel 114.

Referring now to FIG. 1G, the bezel 114 is illustrated to include a cross-sectional profile depth 144 in a depth direction, e.g., a direction perpendicular to the longitudinal axis of the bezel 114. The cross-sectional profile depth 144 of the bezel 114 and/or any bezel of system 100 may be any desired value. For example, according to one approach, the cross-sectional profile depth of a bezel may be selected in accordance with the distance that extends from EIA rails in the back of the computer rack to the back of the computer rack.

By implementing bezels having the appropriate cross-sectional profile depth, system 100 may prevent unauthorized access to any type of computer, regardless of whether a computer residing in a slot of the computer rack extends beyond the members coupled thereto. For example, according to one approach, a computer residing in a slot of the computer rack may include face handles that extend beyond the members of the computer rack, e.g., extending away from the computer rack. In such an approach, the bezel may have a cross-sectional profile depth that enables the handles of the computer to be covered, as well as prevents unauthorized access to all other face portions of the computer.

According to various approaches, various bezels of system 100 may have different cross-sectional profile depths relative to one another, e.g., see FIGS. 1H-1I.

FIG. 1H illustrates a cross-sectional view of the bezel 112 of system 100. The bezel 112 includes a cross-sectional profile depth 146.

According to one approach, one of the bezels, such as one of the second bezels of the second frame of system 100, may have a deeper cross-sectional profile in a depth direction than another of the bezels. For example, referring now to FIG. 1I, a cross-sectional view of an illustrative bezel 148 with a lock 150 includes a cross-sectional profile depth 152 in a depth direction. With joint reference now to FIGS. 1H-1I, note that the cross-sectional profile depth 152 of the bezel 148 is deeper than the cross-sectional profile depth 146 of the bezel 112.

Bezels installed on a back portion of a computer rack may cover back portions of computers in the computer rack. Power and/or network cords commonly extend out of the back portions of computers, and it may be desirable to protect these cords from being accessed by an unauthorized user. Accordingly, bezels, e.g., such as bezel 148, having a relatively deeper cross-sectional profile in a depth direction than the bezels of the first frame 102 may allow such cords to remain concealed. For example, at least a portion of one or more cords of a computer may be stored in an inner portion of the bezel while the bezel is locked to the second frame.

According to various approaches, the difference in cross-sectional profile depths 146, 152 of at least one bezel of the first frame 102 and at least one bezel of the second frame may vary. For example, according to one approach, the difference in cross-sectional profile depths 146, 152 of at least one bezel of the first frame 102 and at least one bezel of the second frame may be relatively minimal. In contrast, according to another approach, the difference in cross-sectional profile depths 146, 152 of at least one bezel of the first frame 102 and at least one bezel of the second frame may be relatively large.

Of course, in some approaches, the front face of the computers may include various components of various depths, e.g., along in an insertion direction (of a computer into the rack), and it may be desirable to cover all portions of the front face components with a bezel. Accordingly, although the bezels of system 100 are illustrated in various FIGS. to include a planar front facing profile, according to other approaches, the bezels may be configured to substantially pair with the front facing profile of computers in the computer rack 104. For example, according to one approach, a portion of the front face of one of the bezels may extend outward in accordance with a portion of the computer that also extends out.

Moreover, any of the bezels of system 100 may be branded, e.g., thereby displaying a company name, thereby displaying a company logo, thereby displaying contact information of the owner/renter of the computer rack slot, etc. Such branding may distinguish the owners/renters of the computer and/or slot of the computer rack, especially in shared computer racks.

Referring now to FIG. 1J, according to various approaches, the frame 102 may be pivotally coupled to the computer rack 104. Accordingly, system 100 may include one or more hinges 154 coupled to the frame 102 for pivotable coupling with the computer rack 104. For example, the hinges 154 of the frame 102 may be coupled with cooperating features 156, e.g., pins, slots, tabs, etc., of the computer rack 104. The frame 102 may be advanced towards the computer rack 104 in an insertion direction 158 to facilitate the coupling between the hinges 154 of the frame 102 and the cooperating features 156 of the computer rack 104.

The frame 102 is preferably mountable to the computer rack 104 without disrupting equipment inside the computer rack 104. For example, equipment, e.g., computers, rack rails 120, fans, etc., that may reside inside the computer rack 104 preferably does not need to be removed from the computer rack 104 during installation of, e.g., the frame 102, bezels, the cutout 166, etc. This will prove especially appealing and beneficial in shared computer racks and/or computer racks with computers housed therein, as installation may be performed without causing downtime to the computers in the computer rack.

System 100 may additionally include a lock 162 for selectively locking the frame 102 to the computer rack 104. For example, a tab portion 164 of the lock 162 may pass through a cutout 166 of the computer rack 104, and selectively lock the frame 102 to the computer rack 104, e.g., in response to the tab portion 164 of the lock 162 being rotated into a locked position.

In response to the frame being pivotally coupled with the computer rack 104, e.g., via the hinges 154 and the cooperating features 156, the frame may pivot in a direction 160, thereby positioning the frame to be locked to the computer rack 104, or pivoted out of the way of the entrance of the computer rack 104 for allowing access to the computers and/or slots of the computer rack 104, e.g., for servicing. It is important to note that in preferred approaches, a key for the lock 162 will only be selectively distributed to a manager/owner of the computer rack, and not to each of the customers of the computer rack where the computer rack is a shared computer rack. For example, the owner of a data center computer rack may have access to all of the computers and/or slots of the computer rack by unlocking the lock 162 of the frame 102, while customers of the computer rack will only have access to their computers and/or slots by unlocking associated bezels from the computer rack. This provides the privacy/selective security of computers in the computer rack. Thus, the present approach should not be confused with conventional shared server racks with a locking door, where each customer of the shared server rack is provided a key that provides full access to the contents of the shared computer rack.

Figure 2A:
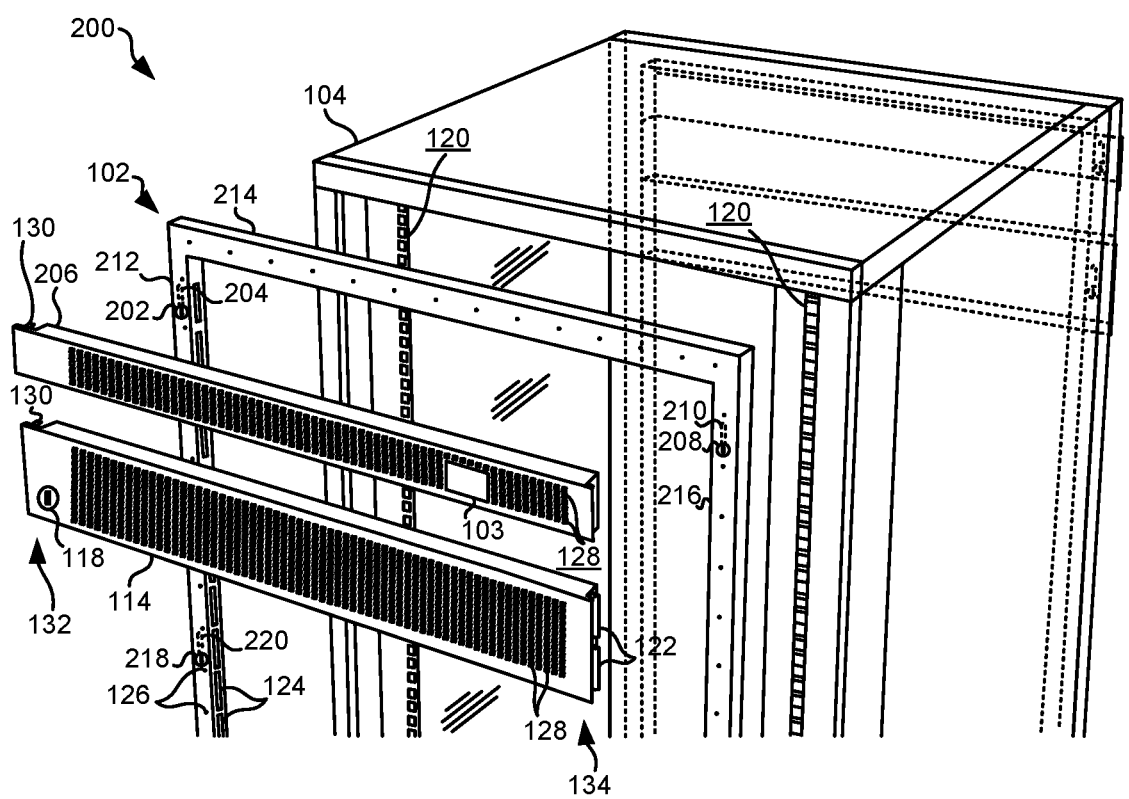
FIG. 2A is an exploded partial perspective view of a frame with locks, two bezels, and a computer rack.
Figure 2B:
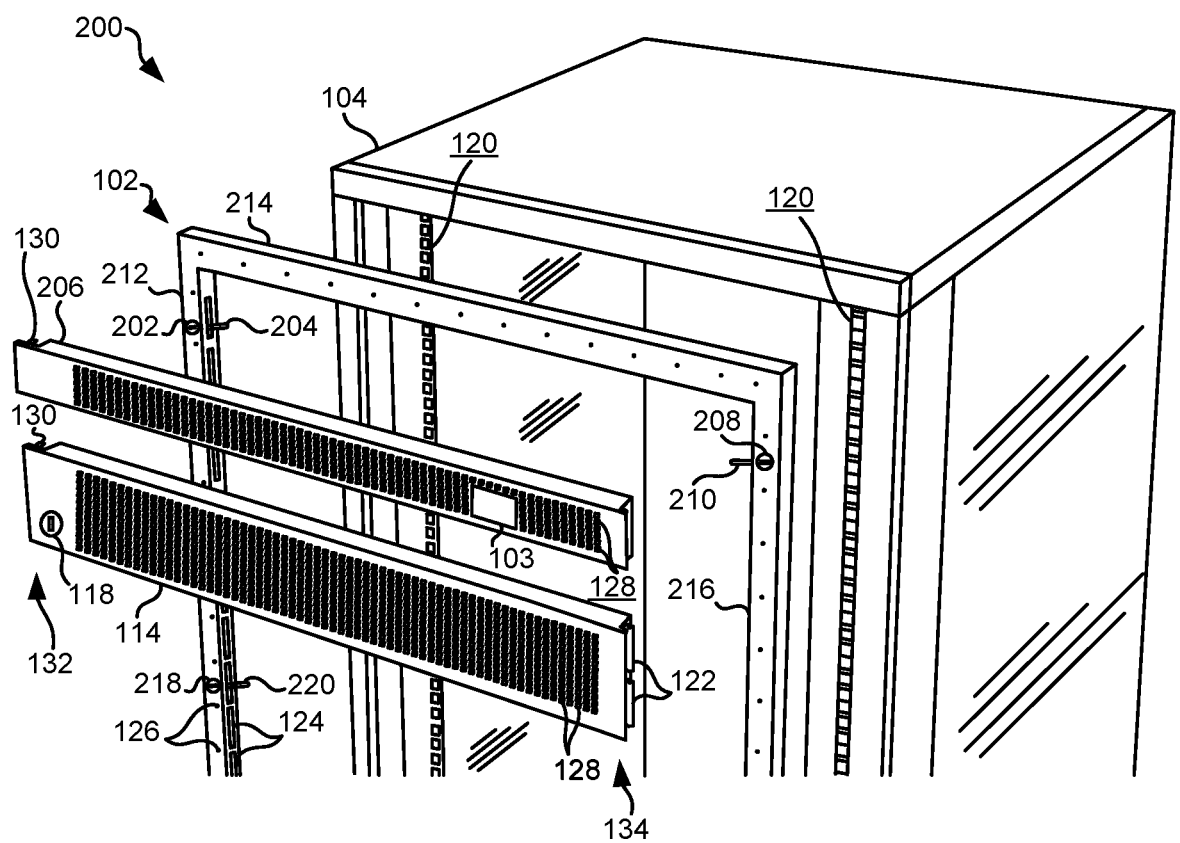
FIG. 2B is an exploded partial perspective view of the frame with locks, two bezels, and the computer rack of FIG. 2A.

It should be noted that although each of FIGS. 1A-1G illustrate each lock 116 as being mounted to one of the bezels 112, 114, according to further approaches, one or more locks may additionally and/or alternatively be mounted to the frame 102, e.g., see FIGS. 2A-2B.

FIGS. 2A-2B depict a system 200 for selectively locking devices and/or slots of a computer rack, in accordance with one embodiment. As an option, the present system 200 may be implemented in conjunction with features from any other embodiment listed herein, such as those described with reference to the other FIGS. Of course, however, such system 200 and others presented herein may be used in various applications and/or in permutations which may or may not be specifically described in the illustrative embodiments listed herein. Further, the system 200 presented herein may be used in any desired environment.

Referring now to FIGS. 2A-2B, system 200 includes a frame 102. The frame 102 may include members 212, 214, 216 oriented in a rectangular (including square) configuration, although in the present embodiment note that the fourth member of the frame 102 that completes the rectangular configuration is not visible in FIGS. 2A-2B. Accordingly, references to each of the members in the present embodiment may correspond to all four members of the frame 102.

System 200 includes at least two locks for selectively locking bezels 206, 114 to at least one of the members 212, 214, 216. One or more of the locks may be mounted to the frame 102. For example, a plurality of locks 202, 218, 208 are shown mounted to the members 212, 216 of the frame 102. In some approaches, all of the locks for mounting the bezels to the frame are located on the frame. In another approach, as shown, one or more of the locks may be mounted to one or more of the bezels and other locks may be mounted on the frame. For example, a lock 118 is shown mounted to the bezel 114.

Each of the locks 202, 218, 208 mounted to the frame 102 may be selectively switchable between an extended position, e.g., see FIG. 2B, and a retracted position, e.g., see FIG. 2A. In the extended position, extending portions 204, 220, 210 of the locks 202, 218, 208 may lock the associated bezel to the frame, thereby preventing computers from being inserted into and/or removed from a respective slot of a computer rack 104.

According to various approaches, the extending portions 204, 220, 210 of the locks 202, 218, 208 may pass through cutouts of the members 212, 216 when in the extended position. For example, the extending portions 204, 220 of the locks 202, 218 shown are configured to pass through slot mounting features 124 of the frame member 212. Similarly, the extending portion 210 of the lock 208 is configured to pass through slot mounting features of the frame member 216.

According to one approach, in the extended position, extending portions 204, 220, 210 of locks 202, 218, 208 mounted to members 212, 216 may engage with cooperating mounting features of the one or more bezels 206, 114, and thereby selectively lock the bezels 206, 114 to the member 212, 216 that includes the associated lock 202, 218, 208. For example, in FIGS. 2A-2B, the extending portions 204, 210 of the locks 202, 208 may engage with cooperating mounting features of the bezel 206 and thereby selectively lock the bezel 206 to the members 212, 216.

Figure 3A:
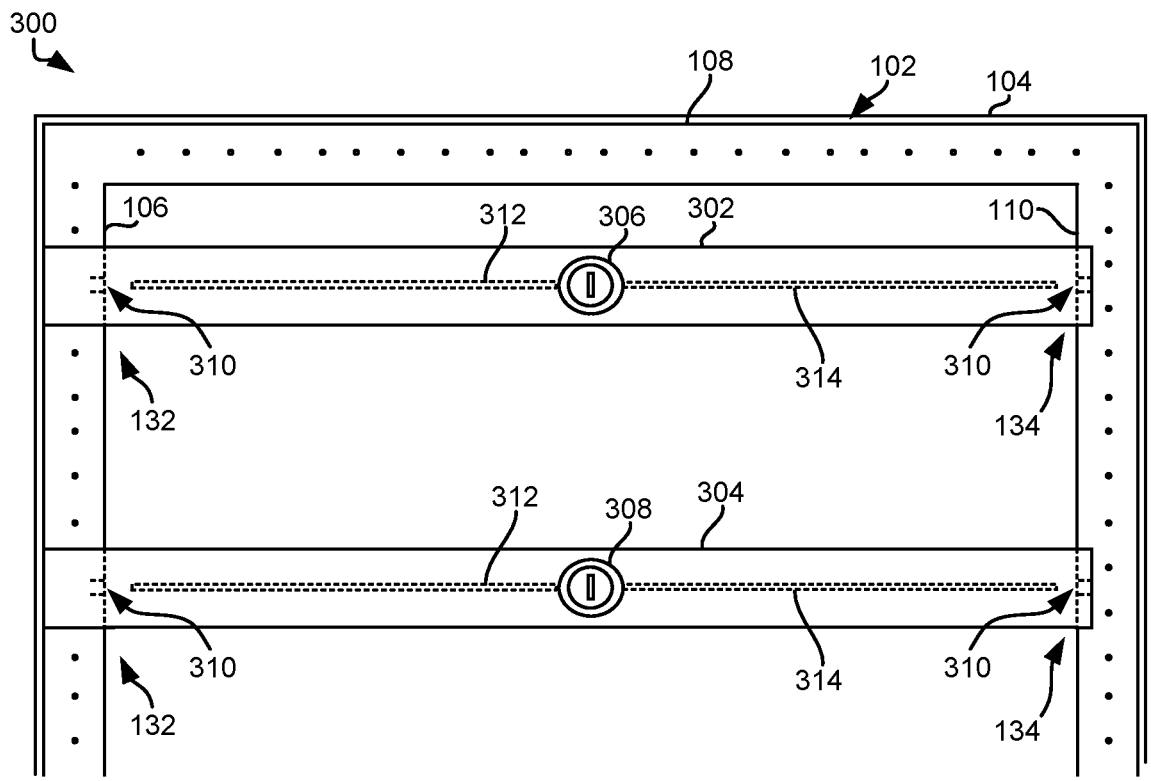
FIG. 3A is a partial front view of a computer rack with members, and bezels with locks in the unlocked position.
Figure 3B:
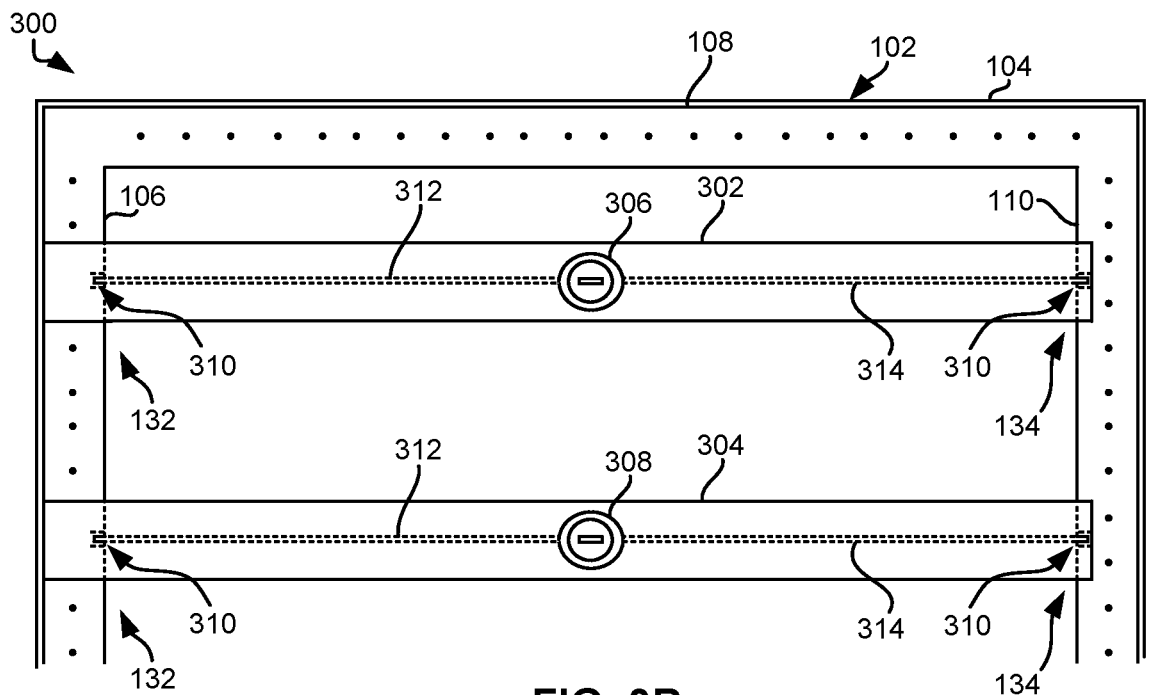
FIG. 3B is a partial front view of the computer rack, members, and bezels of FIG. 3A, with the locks of the bezels in the locked position.

One or more bezel of the various systems described herein may additionally and/or alternatively include a single lock, that is configured to lock an associated bezel to opposite members when engaged, e.g., see FIGS. 3A-3B.

FIGS. 3A-3B depict a system 300 for selectively locking devices and/or slots of a computer rack, in accordance with one embodiment. As an option, the present system 300 may be implemented in conjunction with features from any other embodiment listed herein, such as those described with reference to the other FIGS. Of course, however, such system 300 and others presented herein may be used in various applications and/or in permutations which may or may not be specifically described in the illustrative embodiments listed herein. Further, the system 300 presented herein may be used in any desired environment.

Referring now to FIG. 3A, system 300 includes a frame 102 for mounting to a computer rack 104. The frame 102 includes members 106, 108, 110 oriented in a rectangular (including square) configuration, although in the present embodiment note that the fourth member of the frame 102 that completes the rectangular configuration is not visible in FIGS. 3A-3B. Accordingly, references to each of the members in the present embodiment may correspond to all four members of the frame 102.

System 300 also includes at least two bezels 302, 304 configured for extending between opposite members 106, 110 of the frame 102.

Moreover, system 300 may include at least two locks 306, 308. According to one approach, each lock 306, 308 may be mounted to one of the bezels 302, 304 for selectively locking the associated bezel 302, 304 to opposing members of the frame 102, e.g., both members 106, 110. Note that the opposing members 106, 110 will be used for an example in the present embodiment, however, system 300 also includes other opposing members which include member 108 and the fourth member of the frame 102. Each of the opposing members 106, 110 may include a plurality of features 310 for receiving oppositely extending portions 312, 314 of the locks 306, 308. For example, according to various approaches, in addition to and/or alternative to the slot features 310 of the opposing members 106, 110, system 300 may include apertures, tabs, cutouts, etc. Similarly, according to various approaches, in addition to and/or alternative to the oppositely extending pin portions 312, 314, system 300 may include ears, tabs, hooks, etc.

According to one approach, as illustrated in FIGS. 3A-3B, the locks 306, 308 may be slide locks. In such an approach, the oppositely extending portions 312, 314 of the locks 306, 308 may be selectively positionable between a retracted position (see FIG. 3A) and a locked position (see FIG. 3B) upon disengaging/engaging of the locks 306, 308.

It should be noted that the bezels 302, 304 are illustrated not locked to the members 106, 110 in FIG. 3A, although according to some approaches, the bezels 302, 304 may contact the members 106, 110 in the unlocked position.

Referring now to FIG. 3B, oppositely extending pin portions 312, 314 of the locks 306, 308 are shown in the locked position. On the locked position, the oppositely extending pin portions 312, 314 may selectively lock the bezels 302, 304 to the members 106, 110 by contacting and/or residing in at least a portion of the slot features 310 of the opposing members 106, 110, respectively.

Figure 4A:
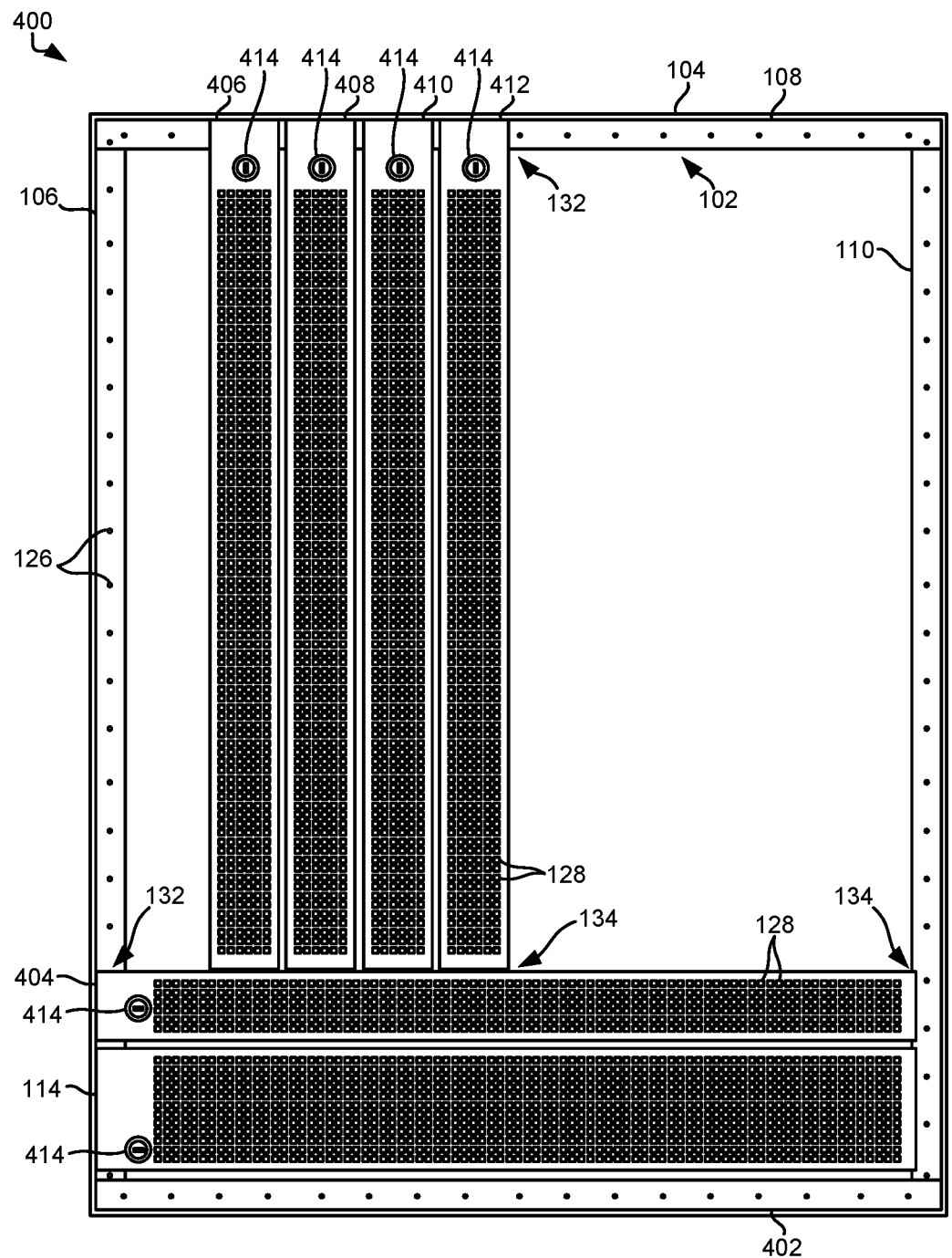
FIG. 4A is a front view of a computer rack, bezels oriented horizontally and vertically, and a frame.
Figure 4B:
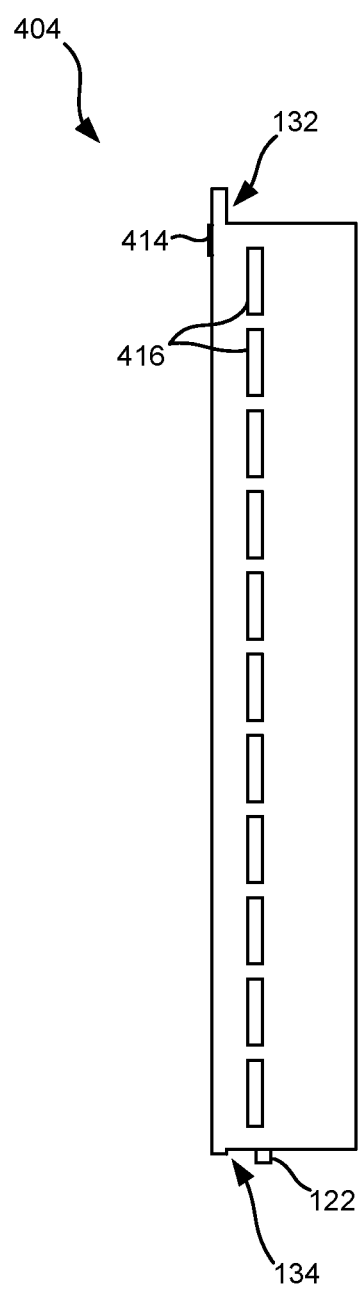
FIG. 4B is a side view of a bezel of FIG. 4A, with slots.

Although various embodiments and approaches described herein include bezels that may be locked to a pair of members mounted to a computer rack in a parallel orientation relative to one another, e.g., see FIGS. 3A-3B, according to a further embodiment, one or more bezels may be coupled to a member and a bezel, e.g., see FIGS. 4A-4B.

FIGS. 4A-4B depict a system 400 for selectively locking devices and/or slots of a computer rack, in accordance with one embodiment. As an option, the present system 400 may be implemented in conjunction with features from any other embodiment listed herein, such as those described with reference to the other FIGS. Of course, however, such system 400 and others presented herein may be used in various applications and/or in permutations which may or may not be specifically described in the illustrative embodiments listed herein. Further, the system 400 presented herein may be used in any desired environment.

Referring now to FIG. 4A, system 400 includes a frame 102 for mounting to a computer rack 104. The frame 102 includes members 106, 108, 110, 402 oriented in a rectangular (including square) configuration.

System 400 includes a plurality of bezels 114, 404, 406, 408, 410, 412. According to one approach, at least one of the bezels may include a lock for selectively locking the bezel to the frame 102. For example, as illustrated in FIG. 4, the bezels 114, 404 include locks 414 for selectively locking the bezels 114, 404 to the member 106 of the frame 102.

According to various approaches, one or more of the bezels may include features for coupling with one or more second bezels each having a longitudinal axis oriented perpendicular to a longitudinal axis of the one of the bezels when coupled thereto. For example, referring to FIG. 4B, the bezel 404 includes mounting features 416, e.g., apertures, for coupling with the cooperating mounting features 122 of other bezels. The mounting features 416 of the bezel 404 may preferably be configured to accept the cooperating mounting features 122 of another bezel having a longitudinal axis oriented perpendicular to a longitudinal axis of the bezel 404 when coupled thereto. For example, referring again to FIG. 4A, four of the bezels 406, 408, 410, 412 are shown coupled to the mounting features (not visible in FIG. 4A) of the bezel 404.

Each of the vertically-oriented bezels 406, 408, 410, 412 may be selectively locked to the member 108 of the frame 102 for blocking access to horizontal slots therebehind, or preferably a vertical slot therebehind, e.g., for preventing a computer from being inserted into and/or removed from the slot of the computer rack 104. Moreover, the horizontal bezel 404 may be locked to the member 106 to prevent a computer from being inserted into and/or removed from a horizontal slot of the computer rack 104 that resides behind the bezel 404. According to another example, the bezel 406 selectively locked to the member 108 may block a computer from being inserted into and/or removed from a slot of the computer rack 104 that resides behind the bezel 406.

Accordingly, the substantially perpendicularly oriented bezels of system 400, e.g., the bezels 114, 404 and the perpendicularly oriented bezels 406, 408, 410, 412, may establish security and selectively limited access of slots and/or computers of a computer rack, e.g., such as computer rack 104, including slots with different longitudinal orientations, e.g., horizontal and vertical longitudinal orientations as in FIG. 4A, or in any other conceivable combination of orientations. The bezels of differing orientations may be particularly useful in computer racks that have multiple diverse orientations of slots and computers, e.g., to utilize all the space of the computer rack. For example, assume that a computer rack includes a 10 U tall cache computer in the lower portion of the computer rack, which is secured using one or more horizontal bezels. In such an example, vertical slots may be added to and/or already be installed in the remaining upper portion of the computer rack not occupied by the 10 U tall cache computer. Accordingly, vertically installed bezels with cooperating mounting features coupled with slots of at least one of the horizontally installed bezels that cover the 10 U tall cache computer, may prevent one or more computers from being inserted into and/or removed from the vertical slots of the computer rack.

It is important to note that conventional computer racks that include a single security door would otherwise disregard personal customer security in order to block a computer from being inserted into and/or removed from a slot of the shared computer rack. This is because as a result of the implementation of the single security door in the conventional rack, each customer of the rack would be given a common key, which would unlock the security door and provide access to the entire conventional rack. In sharp contrast, embodiments such as system 400 instead establish personalized security in shared racks by providing each customer of a shared computer rack customizable security of the customer's rack slots using members, locks and bezels, regardless of the orientation of such slots in the computer rack.

FIGS. 5A-5E depict a system 500 for selectively locking devices and/or slots of a computer rack, in accordance with one embodiment. As an option, the present system 500 may be implemented in conjunction with features from any other embodiment listed herein, such as those described with reference to the other FIGS. Of course, however, such system 500 and others presented herein may be used in various applications and/or in permutations which may or may not be specifically described in the illustrative embodiments listed herein. Further, the system 500 presented herein may be used in any desired environment.

System 500 includes a pair of members 502, 504 for mounting to a computer rack 104 in a parallel orientation relative to one another. Although, in the present approach the pair of members 502, 504 are mounted to the computer rack 104 vertically in a parallel orientation relative to one another, according to various other approaches, the pair of members 502, 504 may be mounted to the computer rack 104 horizontally in a parallel orientation relative to one another. According to yet further approaches, the pair of members 502, 504 may be mounted to the computer rack 104 horizontally or vertically in a parallel orientation relative to one another, and system 500 may include a second pair of members mounted in the opposite orientation as the pair of members 502, 504.

Figure 5A:
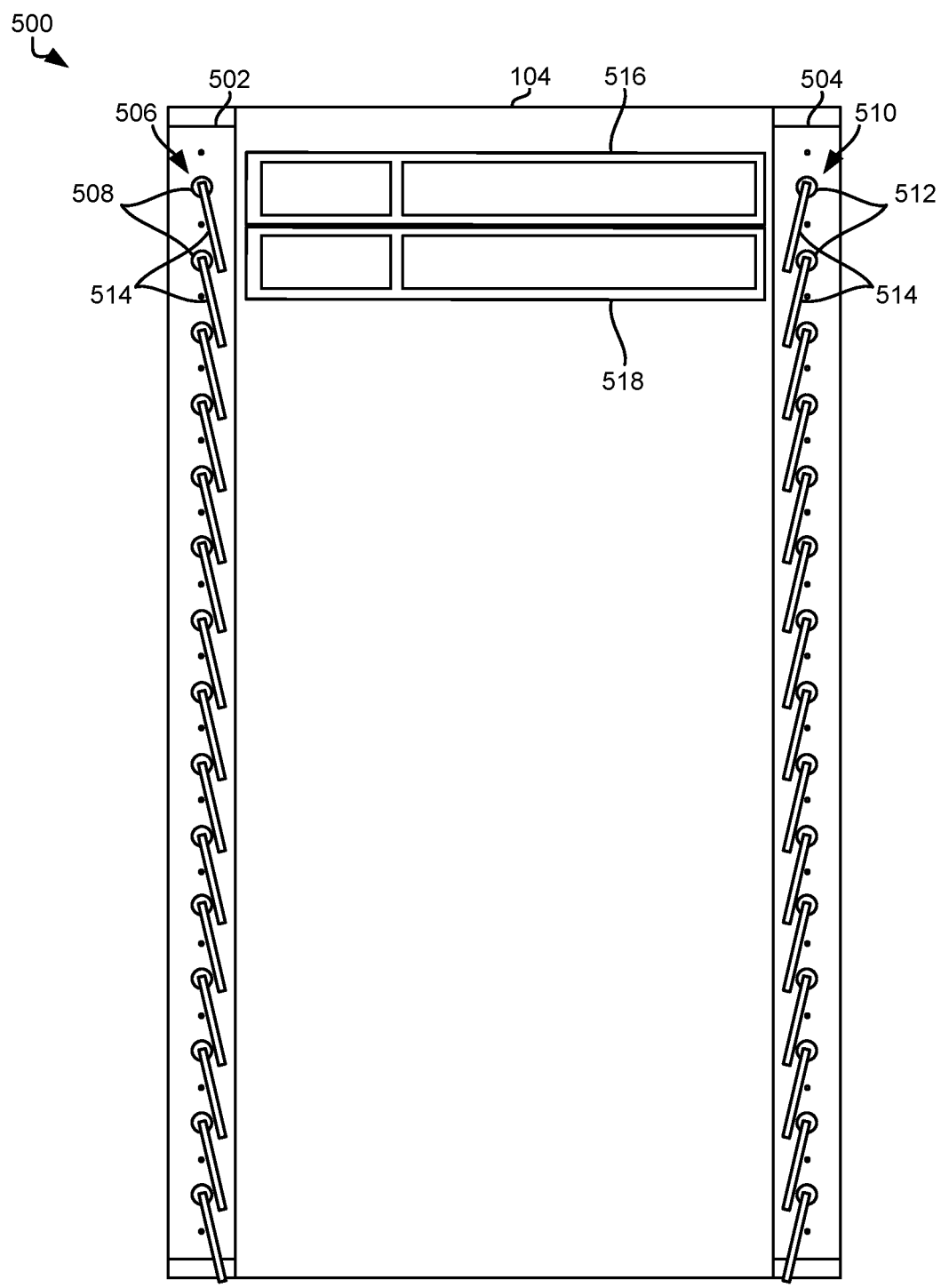
FIG. 5A is a front view of the computer rack with members, and locks in a retracted position.

Referring now to FIG. 5A, system 500 includes an array of locks 508 coupled to one of the members. For example, a first array 506 of locks 508 coupled to the member 502. Moreover, system 500 may additionally include a second array 510 of locks 512 coupled to the other one of the members, e.g., member 504.

Figure 5B:
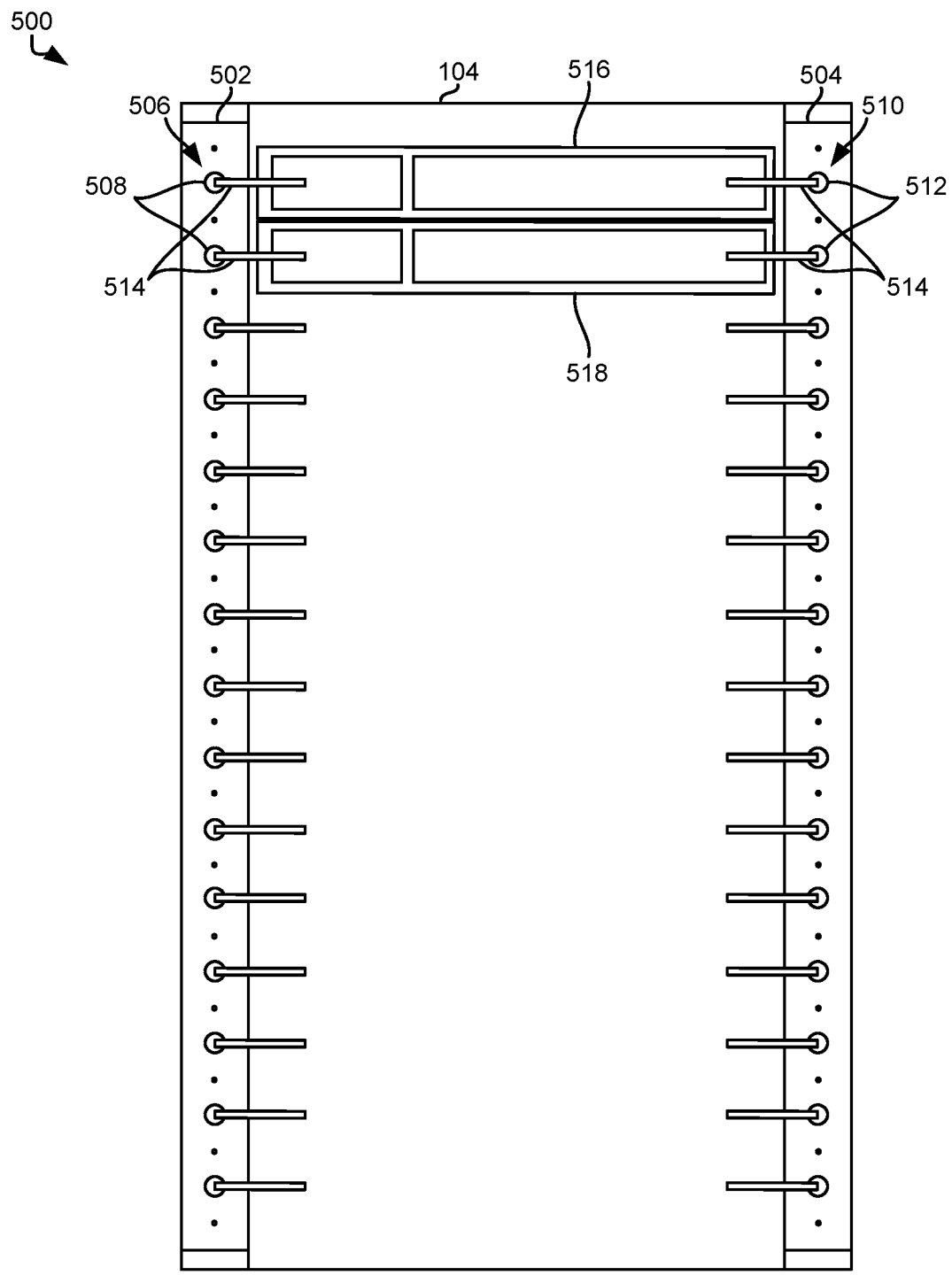
FIG. 5B is a front view of the computer rack of FIG. 5A with the locks in an engaged position.

Each of the locks 508, 512 may include an extending portion 514 that is configured to selectively move between an extended position and a retracted position. For example, in FIG. 5A, the extending portions 514 of each of the locks 508, 512 of system 500 are shown in the retracted position. In FIG. 5B, the extending portions 514 of each of the locks 508, 512 of system 500 are shown in the extended position.

In one approach, the locks 508, 512 may be configured to lock bezels (not shown) to the members 502, 504. For example, the extending portions 514 may extend into apertures on opposing ends of the bezels, thereby locking the bezels to the members.

According to various other approaches, in the extended position, each of the extended portions 514 of the locks 508, 512 block a computer 516, 518 from being inserted into and/or removed from a respective slot of the computer rack 104. In the retracted position, each of the extending portions 514 of the locks 508, 512 may allow one or more computers 516, 518 from being inserted into and/or removed from a respective slot of the computer rack 104. No bezels are present; rather the length of each extending portion 514 is preferably long enough to prevent one or more computers 516, 518 from being inserted into and/or removed from a respective slot.

System 500 may be particularly useful in approaches in which the slots of the computer rack include a drawer configured to allow computers stored therein to be slid out when the extended portions 514 of the locks 508, 512 are in the retracted position. In contrast, the extended portions 514 of the locks 508, 512 may be configured to prevent the drawer from being slid outward from the computer rack when the extended portions 514 are in the extended position.

It should be noted that although the extended portions 514 of the locks 508, 512 are configured to switch between the extended position and the retracted position using rotating locking stops, according to further approaches, the extended portions 514 of the locks 508, 512 may additionally and/or alternatively be configured to switch between the extended position and the retracted position using any type of lock engagement. For example, according to one approach, the extended portions 514 of the locks 508, 512 are configured to switch between the extended position and the retracted position using projecting locking stops. The locks of any of such approaches may include ears and/or flaps in the EIA area and may prevent access to the ear latches and keep the systems and components stored therein from being tampered with and/or removed.

It should moreover be noted that although the extending portions 514 of each of the locks 508, 512 of system 500 are shown to block a computer 516, 518 from being inserted into and/or removed from a respective slot of the computer rack 104 in the extended position, according to further approaches, the extending portions 514 may additionally and/or alternatively be configured to retain the computers 516, 518 when the extending portions 514 are in the extended position. For example, in the extended position, one or more of the extended portions 514 of the locks 508, 512 may be configured to engage cutouts and/or slots of the computers 516, 518 thereby preventing insertion or removal of the computers 516, 518 from the computer rack 104 in either forward or reverse directions.

According to various approaches, the locks 508, 512 may be selectively switched between the extended position and the retracted position using any type of key. In addition and/or alternatively, the locks 508, 512 may be individually selectively switched between the extended position and the retracted position electronically, e.g., using an actuator or other known mechanism. Such electronic locks may be remotely controlled. For example, in such an approach, assuming that the computer rack 104 is a shared computer rack, each customer may be given a unique programmed remote associated with one or more locks 508, 512, that may be used to electronically selectively switch the one or more locks 508, 512 between the extended position and the retracted position.

Figure 5C:
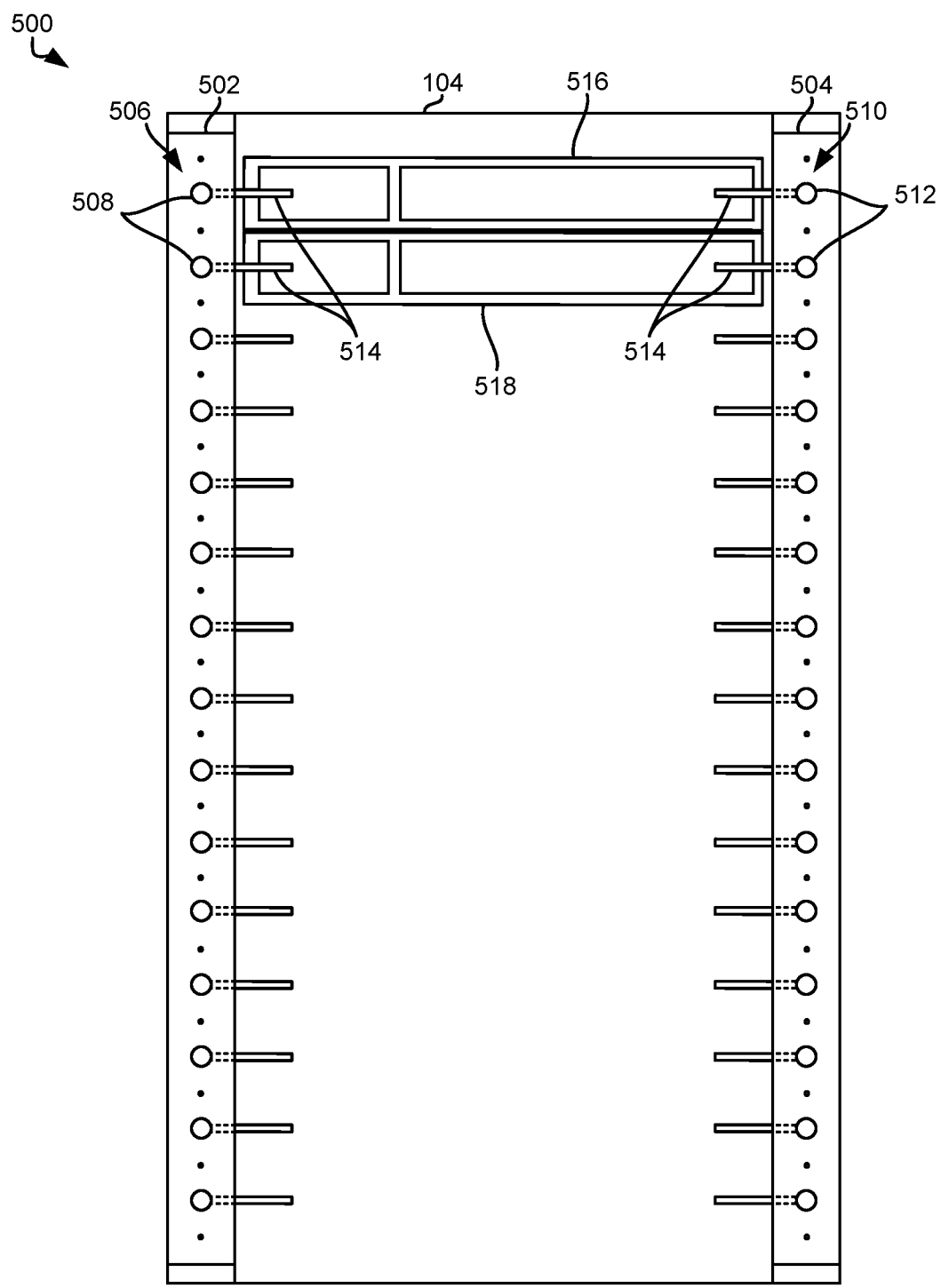
FIG. 5C is a front view of a computer rack with members, and locks in an engaged position.

According to another example, referring now to FIG. 5C one or more of the locks of system 500 may be cut key type locks. For example, in such an approach, assuming that the computer rack 104 is a shared computer rack, each customer may be given a unique key associated with one or more locks 508, 512, that may be used to manually selectively switch the one or more locks 508, 512 between the extended position and the retracted position. Accordingly, according to some approaches, e.g., as illustrated in FIG. 5C, at least a portion of the extending portions 514 of the locks 508, 512 may be positioned on a side of the members 502, 504 that faces the computer rack 104, while a portion of the locks 508, 512, such as a keyhole may be positioned on an accessible side of the members 502, 504 that faces away from the computer rack 104.

According to various approaches, the extending portion 514 of each lock 508, 512 may pass through a cutout of one of the members 502, 504 when the extending portion 514 is in the extended position. For example, in some approaches, the extending portion 514 of each lock 508, 512 may be located on an inner portion of the members 502, 504 when in the retracted position. The inner portion of the members 502, 504 may be located between the side of the members 502, 504 that faces the computer rack 104, and the side of the members 502, 504 that faces away from the computer rack 104.

With continued reference to the locks 508, 512 of system 500, according to various approaches, the extending portion 514 of each lock 508, 512 of one or both of the arrays 506, 510 of locks 508, 512 may be selectively switchable independent of the remaining locks 508, 512 of one or both of the arrays 506, 510 of locks 508, 512.

According to further approaches, the extending portions 514 of at least two locks of one or both of the arrays 506, 510 of locks 508, 512 may be selectively synchronously electronically switchable independent of the remaining locks of the array 506, 510 of locks 508, 512. For example, referring to FIGS. 5A-5B, assume that a user owns the computers 516, 518 and rents the slots in which the computers reside. In such an example, according to one approach, the four locks 508, 512 that in the extended position block the computers from being removed from the rented respective slots of the computer rack 104, may be selectively synchronously electronically switchable independent of the remaining locks 508, 512 of the arrays 506, 510.

According to a more specific approach, the synchronously electronically switchable locks 508 of the array 506 may additionally be electronically switchable independent of the synchronously electronically switchable locks 512 of the array 510. Alternatively, the synchronously electronically switchable locks 508 of the array 506 may be synchronously switched with the synchronously electronically switchable locks 512 of the array 510.

Synchronizing control of all and/or a select portion of locks may reduce the amount of time required to access or lock slots and/or computer(s) of the computer rack 104. This feature may also allow locking and unlocking functions to be controlled from near or afar in some approaches, e.g., via a computer communicating with the locks via a wide area network. While doors of conventional computer racks may allow access to computers of a shared computer rack by simply unlocking the lock to the computer rack door, as noted in detail herein, this type of access allows all users of a shared computer rack to access each-other's computers, which is a security and privacy threat. In sharp contrast, system 500 of the present embodiment allows quick access to computers and/or slots of a computer rack, while providing selective locking of each of such computers and/or slots.

Figure 5D:
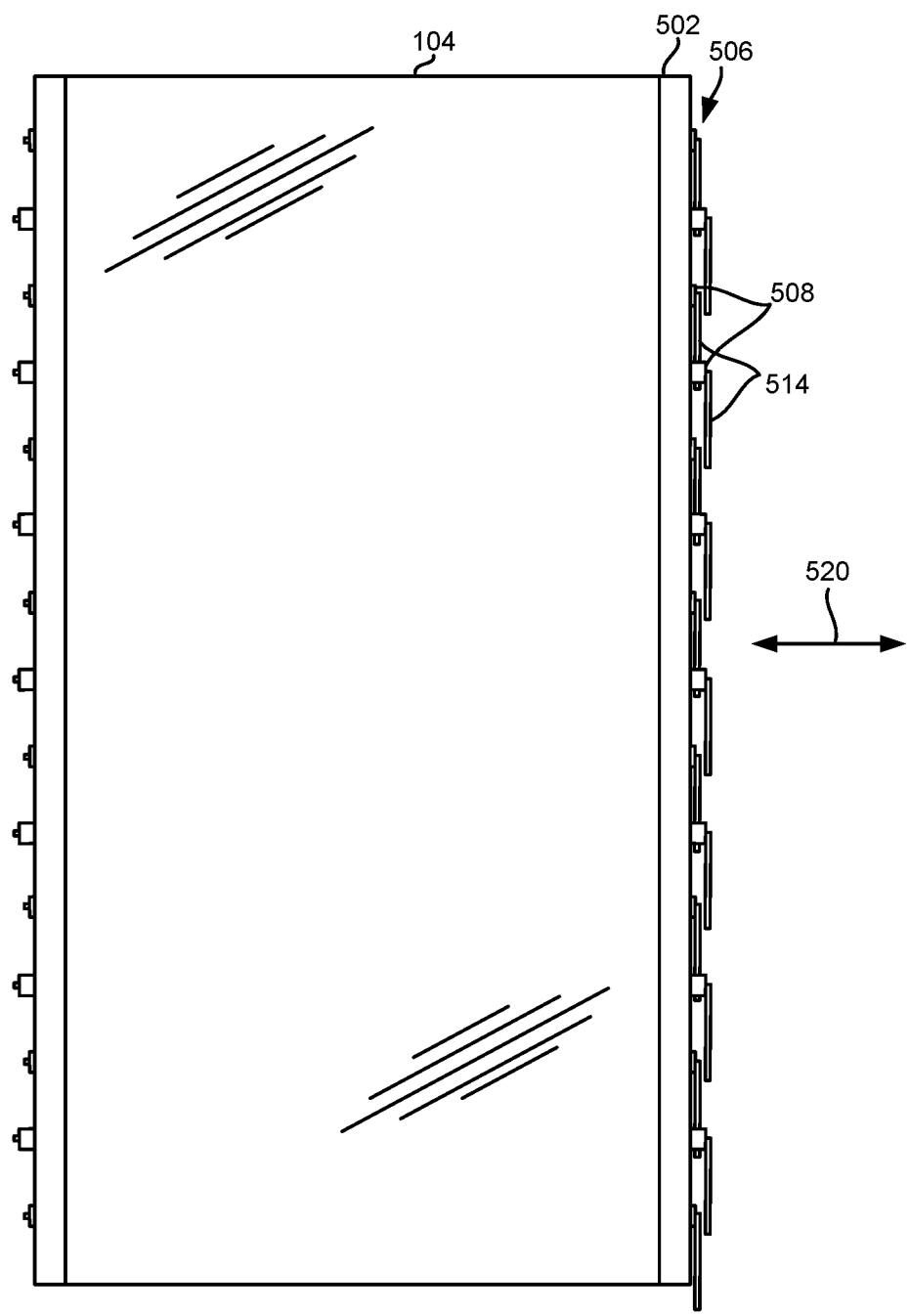
FIG. 5D is a side view of members and locks in the retracted position.
Figure 5E:
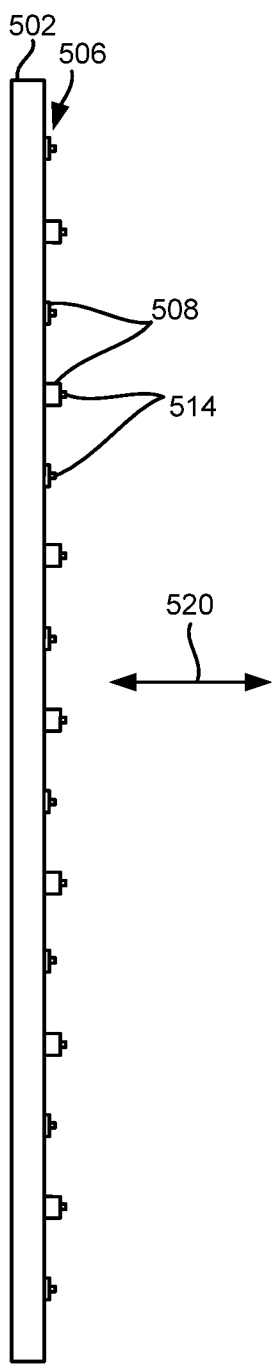
FIG. 5E is a side view of members and locks in the engaged position.

Referring now to FIGS. 5D-5E, a side view of the member 502 and array 506 of locks 508 of FIGS. 5A-5B are shown in accordance with one approach. In FIG. 5D, the extending portion 514 of each lock 508 of the array 506 of locks 508 is shown in the retracted position. It should be noted that according to various approaches, the extending portion 514 of each lock 508 may be offset in a direction 520 parallel to an insertion direction of the computer rack, from the extending portions 514 of adjacent locks. The offsetting of extending portions 514 of adjacent locks prevents each lock 508 from obstructing the extending portions 514 of adjacent locks 508, e.g., during switching between the extended position and the retracted position.

Referring now to FIG. 5E, the extending portions 514 of each of the locks have been switched from the retracted position of FIG. 5D, to the extended position.

With general reference now to system FIGS. 5A-5E, according to various approaches, system 500 may additionally and/or alternatively include a second pair of members for mounting to an opposite side of the computer rack 104 as the first pair of members 502, 504. For example, where the first pair of members 502, 504 is mounted to the front side of a computer rack, the second pair of members may be mounted to the back side of a computer rack. Moreover, the second pair of members are preferably mounted in a parallel orientation relative to one another.

The second pair of members may have a configuration similar to the first pair of members. For example, system 500 may additionally and/or alternatively include a second array of locks coupled to a member of the second pair of members. Similar to the locks 508, 512 of the first pair of members 502, 504, each of the locks of the pair of members may include an extending portion that is configured to selectively switch between an extended position and a retracted position. In the extended position, each of the extended portions of the locks of the second pair of members may block a computer from being inserted into and/or removed from a respective slot through the opposite side of the computer rack 104 as the first pair of members 502, 504.

Locking more than one side of a computer rack provides selective security to more than one side of a computer that are accessible from the outside of the computer rack. Such approaches may be desirable, especially to customers of a shared computer rack because they provide more comprehensive security of the customer's computers when stored in the computer rack. Moreover, such locking may prevent unauthorized users from at least temporarily using and/or accessing empty slots in the computer rack 104. This benefit would be particularly appealing to managers/owners of the computer rack 104, who would be ensured that empty slots in the computer rack 104 would not be used and/or accessed by unauthorized users, provided that the manager/owner of the computer rack 104 engaged the locks associated with such empty slots.

Figure 6A:
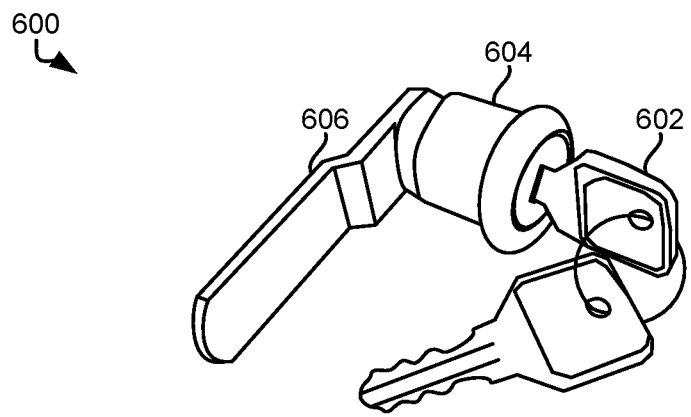
FIG. 6A is a product for selectively locking a bezel to at least one of the members of a system.
Figure 6B:
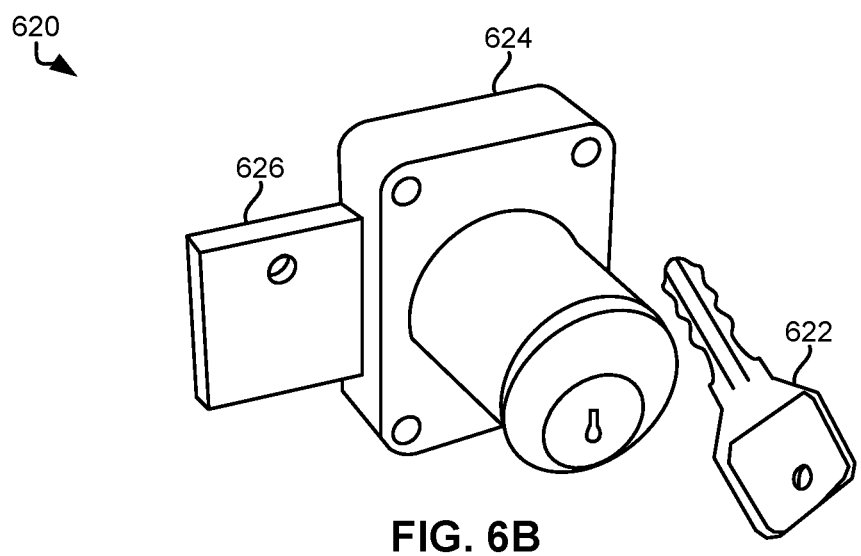
FIG. 6B is a product for selectively locking a bezel to at least one of the members of a system.

FIGS. 6A-6B depict products 600, 620 for selectively locking devices and/or slots of a computer rack, in accordance with one embodiment. As an option, the present products 600, 620 may be implemented in conjunction with features from any other embodiment listed herein, such as those described with reference to the other FIGS. Of course, however, such products 600, 620 and others presented herein may be used in various applications and/or in permutations which may or may not be specifically described in the illustrative embodiments listed herein. Further, the products 600, 620 presented herein may be used in any desired environment.

Referring now to FIG. 6A, product 600 includes a lock 604 (e.g., a cam lock) which may be implemented in one or more of the systems described herein. For example, product 600 may be mounted to a member of a frame for locking selectively locking a bezel to the member. According to another example, product 600 may be mounted to a bezel for selectively locking the bezel to at least one of the members of a frame.

Accordingly, product 600 includes a tab mounting feature 606, which may engage with cooperating mounting features, e.g., of a bezel, of a member, of some other portion of a computer rack, etc., for locking and/or preventing access to computers 136 and/or slots of a computer rack.

Moreover, product 600 may include a key 602 for selectively adjusting the product 600 between an engaged and retracted position when the product is implemented in one or more of the systems described herein.

Referring now to FIG. 6B, product 620 includes a lock 624 (e.g., a slide lock) which may be implemented in one or more of the systems described herein. For example, product 620 may be mounted to a member of a frame for locking selectively locking a bezel to the member. According to another example, product 620 may be mounted to a bezel for selectively locking the bezel to at least one of the members of a frame.

Accordingly, product 620 includes a slide mounting feature 626, which may engage with cooperating mounting features, e.g., of a bezel, of a member, of some other portion of a computer rack, etc., for locking and/or preventing access to computers and/or slots of a computer rack.

Moreover, product 600 may include a key 622 for selectively adjusting the product between an engaged and retracted position when the product 620 is implemented in one or more of the systems described herein.

The various components of the systems and products described herein may be constructed of any suitable material that would become apparent to one skilled in the art upon reading the present disclosure. For example, the bezels may include metal, plastic, etc. The frame members may include metal, plastic, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system comprising:
a pair of members configured to be mounted to rails of a computer rack in a parallel orientation relative to one another,
wherein each of the members includes a plurality of mounting features;
at least two bezels configured to extend between the members and mounting to the members, wherein each of the bezels includes at least one fixed tab cooperating mounting feature that extends linearly from an end portion of an associated one of the bezels, a position of each fixed tab cooperating mounting feature being permanently fixed relative to the associated bezel;
at least two locks,
wherein each lock is mounted to an associated one of the bezels,
wherein each lock is configured to selectively lock the associated bezel to one of the members,
wherein the mounting features are configured to engage the fixed tab cooperating mounting features of the bezels and a portion of the locks
a pair of second members configured to be mounted to an opposite side of the computer rack as the pair of members;
at least two additional bezels configured to extend between the second members and mounting to the second members; and
at least two second locks configured to selectively lock the additional bezels to at least one of the second members,
wherein at least one of the additional bezels has a deeper cross-sectional profile in a depth direction than the bezels,
wherein the depth direction extends perpendicularly from a front face toward a back face of the at least one of the additional bezels.

2. The system of claim 1, wherein each of the mounting features are configured to receive a majority portion of at least one of the fixed tab cooperating mounting features within an interior portion of the mounting features to establish the engagement between the mounting features and the fixed tab cooperating mounting features of the bezels.

3. The system of claim 2, wherein at least one of the members has a plurality of alignment features which are configured to slidably engage with cooperating alignment features included in each of the bezels.

4. The system of claim 3, wherein the cooperating alignment features included in the bezels are pins.

5. The system of claim 1, wherein the at least two locks are slide locks.

6. The system of claim 1, comprising a pair of third members, wherein longitudinal extents of the pair of third members extend vertically between the pair of members.

7. The system of claim 1, wherein one of the at least two bezels includes second mounting features which are configured to couple with one or more vertical bezels, wherein each of the one or more vertical bezels have longitudinal axes oriented perpendicular to a longitudinal axis of the bezel having the second mounting features when coupled thereto, wherein ends of the vertical bezels rest on an exterior of a concave portion of the bezel having the second mounting features when coupled thereto.

8. The system as recited in claim 1, wherein at least one of the bezels has apertures therein which are configured to allow airflow to pass therethrough, wherein at least one of the bezels includes a cutout configured to allow viewing of a graphical interface of a device stored in the computer rack.

9. The system of claim 1, comprising:
third members extending between the pair of members, the members and third members forming a frame;
a hinge coupled to the frame to enable pivotable coupling with the computer rack; and
a supplemental lock configured to selectively lock the frame to the computer rack.

10. A system, comprising:
a frame configured to be mounted to a computer rack, the frame including members oriented in a rectangular configuration;
at least two bezels configured to extend between opposite members of the frame, wherein each of the at least two bezels includes at least one fixed tab cooperating mounting feature that extends linearly from an end portion of an associated one of the bezels, positions of the fixed tab cooperating mounting features being permanently fixed relative to the associated bezels; and wherein each of the bezels has at least one lock configured to selectively lock the associated bezel to both of the members, wherein one of the bezels includes an array of second mounting features extending along a majority of a longitudinal length of the bezel having the second mounting features, wherein the second mounting features are apertures extending into the bezel having the second mounting features, wherein the second mounting features are configured to slidably accept second fixed tab cooperating mounting features of one or more additional bezels, wherein the additional bezels have longitudinal axes oriented perpendicular to a longitudinal axis of the one of the at least two bezels when coupled thereto, the second fixed tab cooperating mounting features being permanently fixed relative to an associated one of the additional bezels, wherein the second fixed tab cooperating mounting features extend linearly from end portions of a longitudinal section of an associated one of the additional bezels.

11. The system of claim 10, wherein at least one of the members has a plurality of alignment features which are configured to engage with cooperating pin alignment features included in the bezels.

12. The system of claim 10, wherein each lock is mounted to one of the bezels to enable the associated bezel to be selectively locked to opposing members of the frame, wherein the opposing members include a plurality of features which are configured to receive oppositely extending portions of the locks.

13. The system of claim 10, comprising:
a second frame configured to be mounted to an opposite side of the computer rack as the frame;
at least two additional bezels configured to extend between opposite members of the second frame; and
at least two second locks configured to selectively lock the additional bezels to the second frame.

14. The system of claim 13, wherein at least one of the additional bezels has a deeper cross-sectional profile in a depth direction than the bezels, wherein the depth direction extends perpendicularly from a front face toward a back face of the at least one of the additional bezels.

15. The system of claim 10, wherein at least one of the bezels has apertures therein which are configured to allow airflow to pass therethrough, wherein at least one of the bezels includes a cutout configured to allow viewing of a graphical interface of a device stored in the computer rack.

16. The system of claim 10, wherein the array of second mounting features is a linear array, wherein the end portions of the additional bezels rest on an exterior of a concave portion of the bezel having the second mounting features when coupled thereto.

17. A system, comprising:
first and second members configured to be mounted to rails of a computer rack in a parallel orientation relative to one another; and
a first array of locks coupled to the first member,
a second array of locks coupled to the second member,
wherein the locks include extending portions that are configured to selectively switch between an extended position and a retracted position while coupled to an associated one of the members,
wherein the extending portions of the first array of locks are positioned more toward the second member when in the extended position than the retracted position,
wherein the extending portions of the second array of locks are positioned more toward the first member when in the extended position than the retracted position,
wherein the extended portions of the locks, when in the extended position, span a portion of a distance between the first and second members, thereby blocking devices from being inserted into and/or removed from slots of the computer rack,
wherein the extending portions of locks of the first array of locks are offset, in a direction parallel to an insertion direction of the computer rack, from the extending portions of adjacent locks of the first array of locks.

18. The system of claim 17, wherein the extending portions of the first array of locks pass through cutouts of the first member when the extending portions are in the extended position.

19. The system of claim 17, wherein the extending portion of at least some of the locks of the first array of locks is selectively switchable independent of the remaining locks of the first array of locks.

20. The system of claim 17, wherein the extending portions of at least two locks of the first array of locks are selectively synchronously electronically switchable independent of the remaining locks of the first array of locks.

21. The system of claim 17, comprising:
a second pair of first and second members configured to be mounted to an opposite side of the computer rack as the pair of members, wherein the second pair of first and second members are configured to be mounted in a parallel orientation relative to one another; and
a third array of locks, the third array of locks being coupled to the first member of the second pair of first and second members, wherein the locks of the third array of locks include extending portions that are configured to selectively switch between an extended position and a retracted position, wherein the extended portions of the locks of the third array of locks, when in the extended position, block devices from being inserted into and/or removed from slots through the opposite side of the computer rack.

22. The system of claim 17, wherein the extended portions of the locks are configured to switch between the extended position and the retracted position using rotating locking stops.

23. The system of claim 17, wherein the extended portions of the locks are configured to switch between the extended position and the retracted position using projecting locking stops.

* * * * *